(12) United States Patent
Moon et al.

(10) Patent No.: US 10,062,691 B2
(45) Date of Patent: *Aug. 28, 2018

(54) SEMICONDUCTOR DEVICE HAVING CONTACT PLUG AND METHOD OF FORMING THE SAME

(71) Applicant: Samsung Electronics Co., Ltd., Suwon-si, Gyeonggi-do (KR)

(72) Inventors: Hyerim Moon, Hwaseong-si (KR); Myounghun Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/460,897

(22) Filed: Mar. 16, 2017

(65) Prior Publication Data
US 2017/0186744 A1    Jun. 29, 2017

Related U.S. Application Data

(63) Continuation of application No. 15/015,289, filed on Feb. 4, 2016, now Pat. No. 9,620,504.

(30) Foreign Application Priority Data

May 4, 2015  (KR) .......................... 10-2015-0062534

(51) Int. Cl.
| | |
|---|---|
| *H01L 29/40* | (2006.01) |
| *H01L 21/44* | (2006.01) |
| *H01L 27/088* | (2006.01) |
| *H01L 27/092* | (2006.01) |
| *H01L 21/8234* | (2006.01) |
| *H01L 27/02* | (2006.01) |

(Continued)

(52) U.S. Cl.
CPC .. *H01L 27/0886* (2013.01); *H01L 21/823431* (2013.01); *H01L 21/823475* (2013.01); *H01L 23/5283* (2013.01); *H01L 27/0207* (2013.01); *H01L 27/0629* (2013.01); *H01L 27/0924* (2013.01)

(58) Field of Classification Search
CPC ........................ H01L 27/0886; H01L 27/0924
USPC .......... 438/666, 672, 675; 257/773, 698, 621
See application file for complete search history.

(56) References Cited

U.S. PATENT DOCUMENTS

| | | |
|---|---|---|
| 8,624,320 B2 | 1/2014 | Schultz |
| 8,679,925 B2 | 3/2014 | Wang |

(Continued)

*Primary Examiner* — Calvin Lee
(74) *Attorney, Agent, or Firm* — Harness, Dickey & Pierce, P.L.C.

(57) ABSTRACT

A semiconductor device includes merged contact plugs. A multi-fin active having N sub-fins is formed in a substrate. A contact plug is formed on the impurity areas. N is an integer between about eight (8) and about one thousand (1000). The N sub-fins include a first sub-fin formed in the outermost portion of the multi-fin active and a second sub-fin formed near the first sub-fin. A straight line perpendicular to a surface of the substrate and passes through a virtual bottom edge of the contact plug is disposed between the first sub-fin and the second sub-fin, or through the second sub-fin. The virtual bottom edge of the contact plug is defined at a cross point of a correlation line extending on a side surface of the contact plug and a horizontal line in contact with a lowermost end of the contact plug and parallel to the surface of the substrate.

20 Claims, 22 Drawing Sheets

(51) Int. Cl.
*H01L 27/06* (2006.01)
*H01L 23/528* (2006.01)

(56) References Cited

U.S. PATENT DOCUMENTS

| | | |
|---|---|---|
| 9,105,660 B2 | 8/2015 | Tsai et al. |
| 9,620,504 B2 * | 4/2017 | Moon ................ H01L 27/0886 257/773 |
| 2014/0183641 A1 | 7/2014 | Fan et al. |
| 2014/0346612 A1 | 11/2014 | Adam et al. |

* cited by examiner

SEMICONDUCTOR DEVICE HAVING CONTACT PLUG AND METHOD OF FORMING THE SAME

CROSS-REFERENCE TO RELATED APPLICATION

This patent application is a continuation of U.S. patent application Ser. No. 15/015,289, filed on Feb. 4, 2016, now U.S. Pat. No. 9,620,504 issued Apr. 11, 2017, which claims priority pursuant to 35 U.S.C. § 119(a) to Korean Patent Application No. 10-2015-0062534 filed on May 4, 2015, the entire disclosure of each of which is hereby incorporated by reference herein.

BACKGROUND

Field

Embodiments of the inventive concepts relate to a semiconductor device including merged contact plugs, and/or a method of forming the same.

Description of Related Art

As semiconductor devices become more highly integrated, it typically becomes more difficult to reduce or substantially prevent leakage current from contact plugs. The contact plugs serve to provide electrical connections between lower patterns and upper interconnections. The lower patterns may be arranged at various intervals to configure a circuit. Since the contact plugs are typically formed on the lower patterns at various intervals, various problems, such as an increase in leakage current, may occur.

SUMMARY

Embodiments of the inventive concepts provide a semiconductor device having improved electrical properties.

Other embodiments of the inventive concepts provide a method of forming a semiconductor device having improved electrical properties.

The technical objectives of the inventive concepts are not limited to the above disclosure; other objectives may become apparent to those of ordinary skill in the art based on the following descriptions.

In accordance with example embodiments of the inventive concepts, a semiconductor device includes a multi-fin active having N sub-fins formed in a substrate. Impurity areas are formed on the sub-fins. A contact plug having a smaller horizontal width than the multi-fin active is formed on the impurity areas. The N sub-fins include a first sub-fin formed in the outermost portion of the multi-fin active and a second sub-fin formed near the first sub-fin. A straight line perpendicular to a surface of the substrate and passes through a virtual bottom edge of the contact plug is disposed between the first sub-fin and the second sub-fin, or through the second sub-fin. The virtual bottom edge of the contact plug is defined at a cross point of a correlation line extending on a side surface of the contact plug and a horizontal line in contact with a lowermost end of the contact plug and parallel to the surface of the substrate.

The impurity areas on the sub-fins may include a same conductivity type impurities.

The N sub-fins may be substantially parallel to each other and have substantially the same pitch P. The horizontal width of the contact plug may be in the range of (N−3)P to (N−1.5)P.

The N sub-fins may include the first sub-fin, an $N^{th}$ sub-fin, and the second sub-fin to an $(N-1)^{th}$ sub-fin. The second to $(N-1)^{th}$ sub-fins may be disposed between the first sub-fin and the $N^{th}$ sub-fin. The first sub-fin and the $N^{th}$ sub-fin may be aligned outside the contact plug.

The contact plug may overlap the second to $(N-1)^{th}$ sub-fins.

The first sub-fin and the $N^{th}$ sub-fin may be configured so as not to overlap the contact plug.

The multi-fin active may include first conductivity type impurities. The impurity areas may include second conductivity type impurities that are different from the first conductivity type impurities. The impurity areas may include a first impurity area formed on the first sub-fin, a second impurity area formed on the second sub-fin, a third impurity area formed on the $(N-1)^{th}$ sub-fin, and a fourth impurity area formed on the $N^{th}$ sub-fin. The contact plug may overlap the second impurity area and the third impurity area.

The first impurity area and the fourth impurity area may be configured so as not to overlap the contact plug.

The semiconductor device may further include a metal silicide layer formed on the second impurity area and the third impurity area. The first impurity area and the fourth impurity area may be spaced apart from the metal silicide layer.

Each impurity area may have a greater horizontal width than a corresponding horizontal width of the N sub-fins.

The impurity areas may include a crystal-growth semiconductor material.

The semiconductor device may further include a metal silicide layer formed between the contact plug and the multi-fin active. The metal silicide layer may be selectively formed below the contact plug.

The semiconductor device may further include a device isolation layer formed in the substrate. The device isolation layer may include a first portion formed between the N sub-fins, and a second portion formed outside the multi-fin active. A lower end of the second portion may be disposed at a lower level than a lower end of the first portion.

N may be an integer in the range of about eight (8) to about one thousand (1000).

The N sub-fins may include the first sub-fin, an $N^{th}$ sub-fin, and the second sub-fin to an $(N-1)^{th}$ sub-fin. The second to $(N-1)^{th}$ sub-fins may be disposed between the first sub-fin and the $N^{th}$ sub-fin. The impurity areas comprise a first impurity area on the first sub-fin, a second impurity area on the second sub-fin, a third impurity area on the $(N-1)^{th}$ sub-fin, and a fourth impurity area on the $N^{th}$ sub-fin. A concentration of a second conductivity type impurities in the second impurity area and the third impurity area may be higher than the concentration of the second conductivity type impurities in the first impurity area and the fourth impurity area.

In accordance with another example embodiment of the inventive concepts, a semiconductor device includes a multi-fin active having N sub-fins formed in a substrate. A gate electrode crossing the multi-fin active is formed. Source/drain areas formed near the gate electrode on the sub-fins are disposed. A contact plug formed on the source/drain areas and having a smaller width than the multi-fin active is disposed. The N sub-fins include a first sub-fin formed in the outermost portion of the multi-fin active and a second sub-fin formed near the first sub-fin. A straight line perpendicular to a surface of the substrate and passes through a virtual bottom edge of the contact plug is disposed between the first sub-fin and the second sub-fin, or through the second sub-fin. The virtual bottom edge of the contact plug is defined at a cross point of a correlation line extending on a side surface of the contact plug and a horizontal line in contact with a lowermost end of the contact plug and parallel to the surface of the substrate.

The gate electrode may substantially completely cross the multi-fin active.

The gate electrode may extend between the N sub-fins. A lower end of the first gate electrode may be disposed at a lower level than upper ends of the N sub-fins.

The semiconductor device may further include a metal silicide layer selectively formed on the source/drain areas disposed below the contact plug.

In accordance with still another example embodiment of the inventive concepts, a semiconductor device includes a well formed in a substrate and including first conductivity type impurities. A first multi-fin active including N sub-fins defined in the well may be disposed. First impurity areas formed on the sub-fins and including second conductivity type impurities that are different from the first conductivity type impurities are disposed. A first contact plug formed on the first impurity areas and having a smaller horizontal width than the first multi-fin active is disposed. A second contact-plug connected to the well is disposed. The N sub-fins include a first sub-fin formed in the outermost portion of the multi-fin active and a second sub-fin formed near the first sub-fin. A straight line perpendicular to a surface of the substrate and passes through a virtual bottom edge of the first contact plug is disposed between the first sub-fin and the second sub-fin, or through the second sub-fin. The virtual bottom edge of the first contact plug is defined at a cross point of a correlation line extending on a side surface of the first contact plug and a horizontal line in contact with a lowermost end of the first contact plug and parallel to the surface of the substrate.

The semiconductor device may further include a second multi-fin active including M sub-fins confined in the well. M may be an integer in the range of about eight (8) to about one thousand (1000). The second contact plug may be aligned on the second multi-fin active. N may be an integer in the range of about eight (8) to about one thousand (1000).

A horizontal width of the second contact plug may be smaller than a horizontal width of the second multi-fin active.

The semiconductor device may further include second impurity areas formed on the M sub-fins of the second multi-fin active. The second impurity areas may be formed between the second contact plug and the M sub-fins.

The second impurity areas may include the first conductivity type impurities.

The second impurity areas may include the second conductivity type impurities.

The semiconductor device may further include a metal silicide layer formed between the second contact plug and the second multi-fin active. The metal silicide layer may be selectively formed below the second contact plug.

In accordance with still another example embodiment of the inventive concepts, a semiconductor device includes a multi-fin active having N sub-fins formed on a substrate. A contact plug formed on the multi-fin active and having a smaller horizontal width than the first multi-fin active is disposed. Each of the N sub-fins has a vertical height greater than a horizontal width. The N sub-fins include a first sub-fin formed in the outermost portion of the multi-fin active and a second sub-fin formed near the first sub-fin. A straight line perpendicular to a surface of the substrate and passes through a virtual bottom edge of the contact plug is disposed between the first sub-fin and the second sub-fin, or through the second sub-fin. The virtual bottom edge of the contact plug is defined at a cross point of a correlation line extending on a side surface of the contact plug and a horizontal line in contact with a lowermost end of the contact plug and parallel to the surface of the substrate. The N sub-fins are substantially parallel to each other and have substantially the same pitch P.

The horizontal width of the contact plug may be in the range of $(N-3)P$ to $(N-1.5)P$.

In accordance with an example embodiment of the inventive concepts, a semiconductor device includes a plurality of sub-fins in a substrate. A plurality of impurity areas are formed on the plurality of sub-fins. A contact plug is formed on the plurality of impurity areas. A first sub-fin is longitudinally outside a line extending from a first side surface of the contact plug.

A last sub-fin may be longitudinally outside a line extending from a second side surface of the contact plug opposite the first side surface.

The plurality of sub-fins may include between about 8 sub-fins and about 1000 sub-fins.

A portion of a second sub-fin adjacent to the first sub-fin may be longitudinally outside the line extending from the first side surface of the contact plug.

A portion of a next-to-last sub-fin adjacent to the last sub-fin may be longitudinally outside the line extending from the second side surface of the contact plug.

Impurity areas of adjacent sub-fins may be of opposite types.

In accordance with an example embodiment of the inventive concepts, a semiconductor device includes a first multi-fin active including N sub-fins in a substrate. A plurality of first impurity areas are formed on the N sub-fins. A first contact plug is formed on the plurality of first impurity areas having a smaller horizontal width than the first multi-fin active. A second multi-fin active including K sub-fins is formed in the substrate. A plurality of second impurity areas are formed on the K sub-fins. A second contact plug is formed on the plurality of second impurity areas. N is an integer in the range of about eight (8) to about one thousand (1000). K is an integer in the range of two (2) to seven (7). The N sub-fins include a first sub-fin at the outermost portion of the first multi-fin active and a second sub-fin near the first sub-fin. A first straight line perpendicular to a surface of the substrate and passes through a first virtual bottom edge of the first contact plug is disposed between the first sub-fin and the second sub-fin, or through the second sub-fin. The virtual bottom edge of the first contact plug is defined at a cross point of a correlation line extending on a side surface of the first plug and a horizontal line in contact with a lowermost end of the first contact plug and parallel to the surface of the substrate.

The second contact plug may overlap a first sub-fin at the outermost portion of the second multi-fin active.

The first impurity areas on the N sub-fins may include a same conductivity type impurities.

The N sub-fins may include the first sub-fin, an $N^{th}$ sub-fin, and the second sub-fin to an $(N-1)^{th}$ sub-fin. The second to $(N-1)^{th}$ sub-fins may be between the first sub-fin and the $N^{th}$ sub-fin. The first impurity areas comprise a first impurity area on the first sub-fin, a second impurity area on the second sub-fin, a third impurity area on the $(N-1)^{th}$ sub-fin, and a fourth impurity area on the $N^{th}$ sub-fin. A concentration of a second conductivity type impurities in the second impurity area and the third impurity area may be higher than the concentration of the second conductivity type impurities in the first impurity area and the fourth impurity area.

The N sub-fins may be substantially parallel to each other and have substantially a same pitch P. The horizontal width of the first contact plug may be (N−3)P or more and (N−1.5)P or less.

Details of other example embodiments are included in the detailed description and drawings.

BRIEF DESCRIPTION OF THE DRAWINGS

The foregoing and other features and advantages of the inventive concepts will be apparent from the more particular description of example embodiments of the inventive concepts, as illustrated in the accompanying drawings in which like reference numerals denote the same respective parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
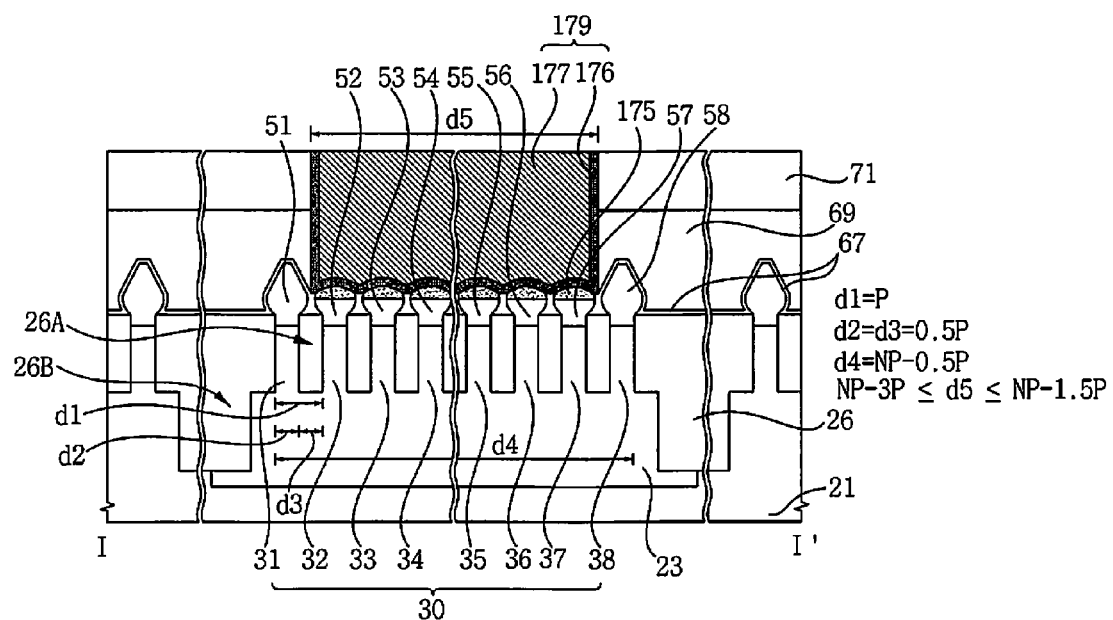
FIG. 1 is a cross-sectional view for describing a semiconductor device in accordance with an example embodiment of the inventive concepts.

Advantages and features of the example inventive concepts and methods thereof will be made apparent with reference to the accompanying figures and the example embodiments to be described below in detail. However, the inventive concepts should not be limited to the example embodiments set forth herein and may be construed as various embodiments in different forms. Rather, these example embodiments are provided so that disclosure of the inventive concepts is thorough and complete, and fully conveys the inventive concepts to those of ordinary skill in the art. The inventive concepts are defined by the appended claims.

The terminology used herein is only intended to describe example embodiments of the inventive concepts and not intended to limit the scope of the inventive concepts. As used herein, the singular forms "a," "an," and "the" are intended to include the plural forms as well, unless specifically indicated otherwise. The terms "comprises" and/or "comprising" that are used herein specify the presence of mentioned elements, steps, operations, and/or devices, but do not preclude the presence or addition of one or more of other elements, steps, operations, and/or devices.

When one element (elements) is (are) "connected" or "coupled" to other element(s), this may indicate that the one element (elements) is directly connected or coupled to the other elements(s), or intervening elements may be present. On the other hand, when one element referred to as "directly connected (directly connected to)" or "directly coupled (directly coupled to)" other element(s), there are no intervening element(s). Throughout the entire specification, the same reference numerals refer to the same components. The "and/or" includes each and all combinations of one or more of the items mentioned.

Spatially relative terms, such as "below," "beneath," "lower," "above," "upper," and the like, may be used herein to easily describe the correlation between one device or elements and another device or other elements as illustrated in the figures. The spatially relative terms should be understood as terms that include different orientations of the device in additional usage or operation of the orientations illustrated in figures. For example, when the device illustrated in the figures is turned over, the device described as disposed "below" or "beneath" another device may be disposed "above" the other device. Accordingly, the example term "below" or "beneath" may include both orientations of below and above. The device may be oriented at other orientations, and the spatially relative terms used herein may be interpreted accordingly.

Further, embodiments are described herein with reference to cross-sectional views and/or plan views that are idealized schematic views of the inventive concepts. The thicknesses of layers and parts in the figures are overstated for the effective description of technical content. Thus, shapes of the schematic views may vary according to manufacturing techniques and/or tolerances. Therefore, the embodiments of the inventive concepts are not limited to the particular shapes illustrated herein but are to include deviations in shapes formed in accordance with the manufacturing process. For example, an etched region illustrated as a rectangular shape may be a rounded shape or a shape of a certain curvature. Thus, the regions illustrated in the figures are schematic in nature, and the shapes of the regions illustrated in the figures are intended to illustrate particular shapes of regions of devices and not intended to limit the scope of the inventive concepts.

Further, like numbers refer to like elements throughout the entire text herein. Thus, the same or similar numbers may be described with reference to other figures even if those numbers are neither mentioned nor described in the corresponding figures. Further, elements that are not denoted by reference numbers may be described with reference to other figures.

The terms such as "front side" and "back side" are used herein as relative concepts to describe the embodiments of the inventive concepts for easy understanding. Thus, the terms "front side" and "back side" do not necessarily indicate specific directions, locations, or elements but can be used interchangeably. For example, a term "front side" may be interpreted as a term "back side," and a term "back side" may be interpreted as a term "front side." Accordingly, the term "front side" may be expressed as a term "first side," and a term "back side" may be expressed as a term "second side." Conversely, a term "back side" may be expressed as a term "first side," and a term "front side" may be expressed as a term "second side." However, the terms "front side" and "back side" are not used in the same sense in one embodiment.

A term such as "near" used herein indicates that any one of at least two elements having symmetrical concepts is disposed nearer to another specific element than the others thereof. For example, the expression such as a first end is close to a first side may be inferred as the first end is closer to the first side than a second end, or the first end is closer to the first side than a second side.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the embodiments may be cylindrical, other tubular cross-sectional forms are contemplated, such as square, rectangular, oval, triangular and others.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a cross-sectional view for describing a semiconductor device in accordance with an example embodiment of the inventive concepts.

Referring to FIG. 1, a well 23, a device isolation layer 26, a first multi-fin active 30, impurity areas 51 to 58, an etch stop layer 67, a lower insulating layer 69, an upper insulating layer 71, a first metal silicide layer 175, and a first contact plug 179 may be formed on a substrate 21. The first multi-fin active 30 may include N sub-fins 31 to 38. The first multi-fin active 30 may include a first sub-fin 31, a second sub-fin 32, a third sub-fin 33, a fourth sub-fin 34, an $(N-3)^{th}$ sub-fin 35, an $(N-2)^{th}$ sub-fin 36, an $(N-1)^{th}$ sub-fin 37, and an $N^{th}$ sub-fin 38. Here, N is an integer greater than about eight (8) and smaller than about one thousand (1000). The first contact plug 179 may include a first barrier layer 176 and a first conductive layer 177. The impurity areas 51 to 58 may be interpreted as source/drain areas. In one example embodiment, a portion of a second sub-fin 32 adjacent to the first sub-fin 31 is longitudinally outside the line extending from a side surface of the contact plug. In one example embodiment, a portion of a $(N-1)^{th}$ sub-fin 37 adjacent to the $N^{th}$ sub-fin 38 is longitudinally outside the line extending from the other side surface of the contact plug.

Figure 2:
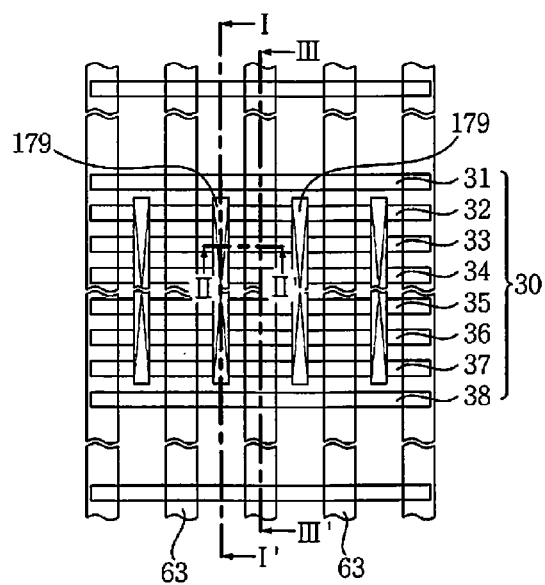
FIG. 2 is a layout for describing a semiconductor device in accordance with an example embodiment of the inventive concepts.

FIG. 2 is a layout for describing a semiconductor device in accordance with an example embodiment of the inventive concepts.

Referring to FIG. 2, gate electrodes 63 crossing a first multi-fin active 30 may be formed. First contact plugs 179 may be formed on the first multi-fin active 30 disposed between the gate electrodes 63. First to $N^{th}$ sub-fins 31 to 38 may be substantially parallel to each other. The first contact plugs 179 may cross the second to $(N-1)^{th}$ sub-fins 32 to 37. The first sub-fin 31 and the $N^{th}$ sub-fin 38 may be disposed outside the first contact plugs 179. The first sub-fin 31 and the $N^{th}$ sub-fin 38 may be configured so as not to overlap the first contact plugs 179.

Figure 3:
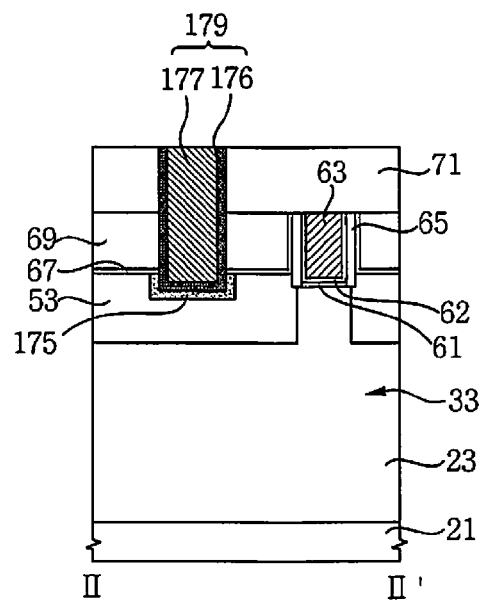
FIGS. 3 and 4 are cross-sectional views for describing a semiconductor device in accordance with an example embodiment of the inventive concepts.

FIG. 3 is a cross-sectional view for describing a semiconductor device in accordance with an example embodiment of the inventive concepts.

Referring to FIG. 3, a well 23, a third sub-fin 33, an impurity area 53, a lower gate dielectric layer 61, an upper gate dielectric layer 62, a gate electrode 63, a spacer 65, an etch stop layer 67, a lower insulating layer 69, an upper insulating layer 71, a first metal silicide layer 175, and a first contact plug 179 may be formed on a substrate 21.

Figure 4:
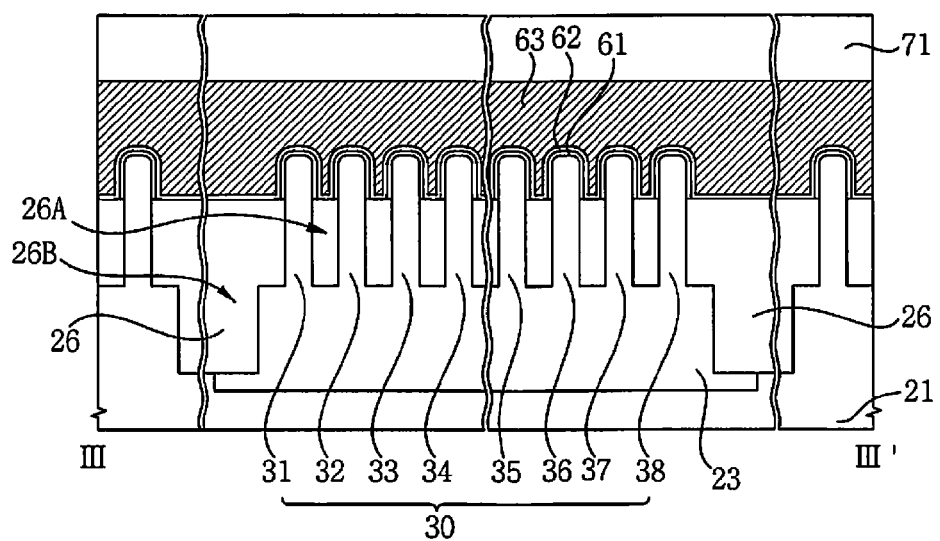

FIG. 4 is a cross-sectional view for describing a semiconductor device in accordance with an example embodiment of the inventive concepts.

Referring to FIG. 4, a well 23, a device isolation layer 26, a first multi-fin active 30, a lower gate dielectric layer 61, an upper gate dielectric layer 62, a gate electrode 63, and an upper insulating layer 71 may be formed on a substrate 21.

FIG. 1 is a cross-sectional view taken along line I-I' of FIG. 2, FIG. 3 is a cross-sectional view taken along line II-II' of FIG. 2, and FIG. 4 is a cross-sectional view taken along line III-III' of FIG. 2. The semiconductor device in accordance with the example embodiments of the inventive concepts may be an input/output (I/O) device or a diode.

Referring again to FIGS. 1 to 4, the substrate 21 may be a semiconductor substrate, such as a silicon wafer or a silicon-on-insulator (SOI) wafer. For example, the substrate 21 may be a single crystalline silicon wafer including p-type impurities. The well 23 may be formed in the substrate 21. For example, the well 23 may be a semiconductor layer including first conductivity type impurities.

The device isolation layer 26 may include an insulating layer, such as silicon oxide, silicon nitride, silicon oxynitride, or a combination thereof. The device isolation layer 26 may include a first portion 26A and a second portion 26B. The first portion 26A of the device isolation layer 26 may be formed between the N sub-fins 31 to 38 of the first multi-fin active 30. The second portion 26B of the device isolation layer 26 may be formed outside the first multi-fin active 30. A lower end of the second portion 26B may be formed at a lower level than a lower end of the first portion 26A. A horizontal width of the second portion 26B may be greater than a horizontal width of the first portion 26A.

The first multi-fin active 30 may be defined in the well 23 by the device isolation layer 26. The first multi-fin active 30 may be a semiconductor layer including the same conductivity type impurities as the well 23. For example, each of the N sub-fins 31 to 38 may be a silicon layer including first conductivity type impurities. Each of the N sub-fins 31 to 38 may have a line shape or a bar shape in a plan view. Each of the N sub-fins 31 to 38 may have a vertical height greater than a horizontal width in a cross-sectional view. The N sub-fins 31 to 38 may be substantially parallel to each other. The first sub-fin 31 and the $N^{th}$ sub-fin 38 may be formed on outermost sides of the first multi-fin active 30. The second to $(N-1)^{th}$ sub-fins 32 to 37 may be sequentially formed between the first sub-fin 31 and the $N^{th}$ sub-fin 38.

The impurity areas 51 to 58 may include a first impurity area 51 formed on the first sub-fin 31, a second impurity area 52 formed on the second sub-fin 32, a third impurity area 53 formed on the third sub-fin 33, a fourth impurity area 54 formed on the fourth sub-fin 34, a fifth impurity area 55 formed on the $(N-3)^{th}$ sub-fin 35, a sixth impurity area 56 formed on the $(N-2)^{th}$ sub-fin 36, a seventh impurity area 57 formed on the $(N-1)^{th}$ sub-fin 37, and an eighth impurity area 58 formed on the $N^{th}$ sub-fin 38. The impurity areas 51 to 58 may include, for example, a crystal growth material. The impurity areas 51 to 58 may include a semiconductor layer formed by a selective epitaxial growth (SEG) method. Horizontal widths of the impurity areas 51 to 58 may be greater than respective horizontal widths of the N sub-fins 31 to 38. Upper ends of the impurity areas 51 to 58 may protrude to a higher level than upper ends of the N sub-fins 31 to 38, respectively. The impurity areas 51 to 58 may contain second conductivity type impurities that are different from the first conductivity type impurities.

For example, the first conductivity type impurities may be n-type impurities, and the second conductivity type impurities may be p-type impurities. The impurity areas 51 to 58 may include a SiGe layer, a Si layer, or a combination thereof containing p-type impurities.

In another example embodiment, the first conductivity type impurities may be p-type impurities, and the second conductivity type impurities may be n-type impurities. The impurity areas 51 to 58 may include a SiC layer, a Si layer, or a combination thereof containing n-type impurities.

The lower gate dielectric layer 61 may be formed between the gate electrode 63 and the N sub-fins 31 to 38. The lower gate dielectric layer 61 may be in direct contact with the N sub-fins 31 to 38. The upper gate dielectric layer 62 may be formed on the lower gate dielectric layer 61. The upper gate dielectric layer 62 may surround a bottom and side surfaces of the gate electrode 63.

The gate electrode 63 may substantially completely cross the first multi-fin active 30 to extend on the second portion 26B of the device isolation layer 26. The gate electrode 63 may extend between the N sub-fins 31 to 38. The gate electrode 63 may cover upper and side surfaces of the N sub-fins 31 to 38. A lower end of the gate electrode 63 may be formed at a lower level than upper ends of the N sub-fins 31 to 38. The spacer 65 may be formed on a side surface of the gate electrode 63. The upper gate dielectric layer 62 may remain between the gate electrode 63 and the spacer 65.

The lower gate dielectric layer 61 may include a chemical oxide formed in a cleaning process. The lower gate dielectric layer 61 may include silicon oxide formed through a reaction of $H_2O_2$ and Si. The lower gate dielectric layer 61 may be referred to as an interfacial oxide. The upper gate dielectric layer 62 may include a high-k dielectric. The gate electrode 63 may include a work-function metal layer and a conductive layer. The spacer 65 may include an insulating layer, such as silicon oxide, silicon nitride, silicon oxynitride, or a combination thereof.

The etch stop layer 67 may cover the impurity areas 51 to 58 and the device isolation layer 26. The etch stop layer 67 may cover side surfaces of the spacer 65. The etch stop layer 67 may include a material having an etch selectivity with respect to the impurity areas 51 to 58. The etch stop layer 67 may include an insulating layer, such as silicon oxide, silicon nitride, silicon oxynitride, or a combination thereof.

The lower insulating layer 69 may be formed on the etch stop layer 67. The lower insulating layer 69 may include an insulating layer, such as silicon oxide, silicon nitride, silicon oxynitride, or a combination thereof. The lower insulating layer 69 may include a material having an etch selectivity with respect to the etch stop layer 67. For example, the lower insulating layer 69 may include silicon oxide such as a tetraethyl orthosilicate (TEOS), and the etch stop layer 67 may include silicon nitride. Upper ends of the gate electrode 63, the upper gate dielectric layer 62, the spacer 65, the etch stop layer 67, and the lower insulating layer 69 may be substantially coplanar.

The upper insulating layer 71 may cover the gate electrode 63, the upper gate dielectric layer 62, the spacer 65, the etch stop layer 67, and the lower insulating layer 69. The upper insulating layer 71 may include an insulating layer, such as silicon oxide, silicon nitride, silicon oxynitride, or a combination thereof.

The first metal silicide layer 175 may be formed on the second to seventh impurity areas 52 to 57. The first contact plug 179 may pass through the upper insulating layer 71, the lower insulating layer 69, and the etch stop layer 67 to be in contact with the second to seventh impurity areas 52 to 57. The first barrier layer 176 may surround a bottom and side surfaces of the first conductive layer 177. The first barrier layer 176 may include Ti, TiN, Ta, TaN, or a combination thereof. The first conductive layer 177 may include W, WN, Ru, Al, Cu, conductive carbon, or a combination thereof.

The N sub-fins 31 to 38 may have substantially the same pitch P. The pitch P may be denoted as a first dimension d1. The N sub-fins 31 to 38 may have substantially the same horizontal width and distance. The horizontal width of each of the N sub-fins 31 to 38 may be referred to as a second dimension d2. The distance between the N sub-fins 31 to 38 may be referred to as a third dimension d3. The second dimension d2 may be substantially the same as the third dimension d3. The second dimension d2 may correspond to half the pitch P. The third dimension d3 may correspond to half the pitch P. A horizontal width of the first multi-fin active 30 may be referred to as a fourth dimension d4. The fourth dimension d4 may correspond to (N−0.5) times the pitch P. The horizontal width of the first contact plug 179 may be smaller than the horizontal width of the first multi-fin active 30. The horizontal width of the first contact plug 179 may be referred to as a fifth dimension d5. The horizontal width of first contact plug 179 may be greater than or equal to (N−3) times the pitch P, and less than or equal to (N−1.5) times the pitch P. According to example embodiments, d1=1), d2=d3=0.5P, d4=(N−0.5)P=NP−0.5P, (N−3)P≤d5≤(N−1.5)P, or NP−3P≤d5≤NP−1.5P.

A straight line passing along a side surface of the first contact plug 179 and substantially perpendicular to the substrate 21 may pass between the first sub-fin 31 and the second sub-fin 32, or through the second sub-fin 32. For example, the straight line passing along the side surface of the first contact plug 179 and substantially perpendicular to the substrate 21 may be aligned between the first sub-fin 31 and the second sub-fin 32. The first contact plug 179 may cover the second to (N−1)$^{th}$ sub-fins 32 to 37. The first sub-fin 31 and the N$^{th}$ sub-fin 38 may be formed outside the first contact plug 179. The first sub-fin 31 and the N$^{th}$ sub-fin 38 may be configured so as not to overlap the first contact plug 179.

The first contact plug 179 may cover the second to seventh impurity areas 52 to 57. The first contact plug 179 may be electrically connected to the second to seventh impurity areas 52 to 57. The first impurity area 51 and the eighth impurity area 58 may be formed outside the first contact plug 179. The first impurity area 51 and the eighth impurity area 58 may be configured so as not to overlap the first contact plug 179. The first impurity area 51 and the eighth impurity area 58 may be separated from the first contact plug 179.

The first metal silicide layer 175 may be aligned below the first contact plug 179. The first metal silicide layer 175 may be selectively formed on the second to seventh impurity areas 52 to 57. The first metal silicide layer 175 may be configured so as not to be formed on the first impurity area 51 and the eighth impurity area 58. The first contact plug 179 may be in direct contact with the first metal silicide layer 175.

FIGS. 5 to 12 are cross-sectional views taken along line I-I' of FIG. 2, for describing semiconductor devices in accordance with example embodiments of the inventive concepts.

Figure 5:
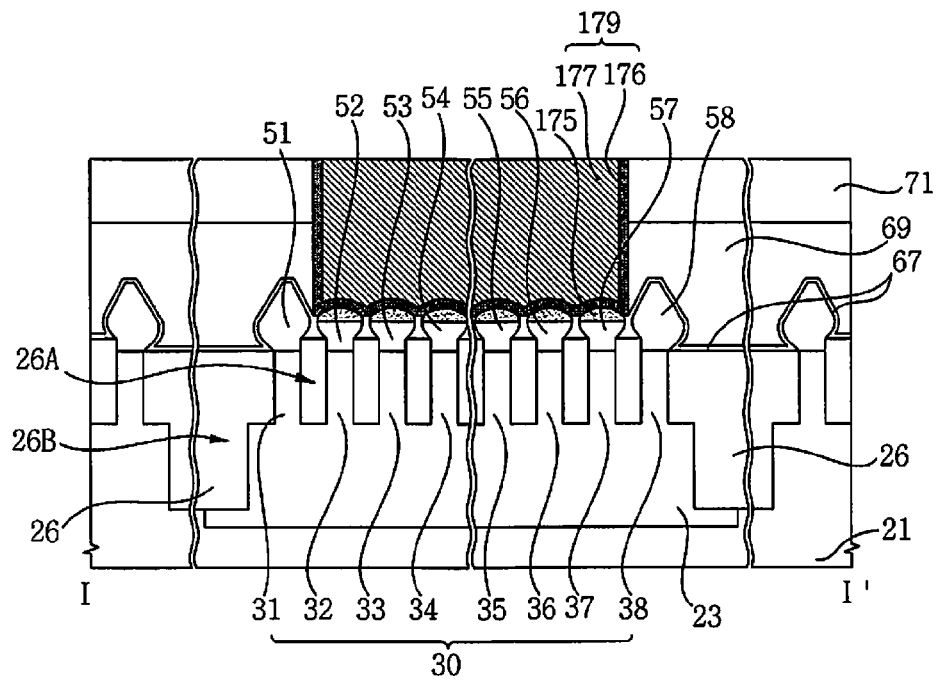
FIGS. 5 to 12 are cross-sectional views for describing semiconductor devices in accordance with example embodiments of the inventive concepts.

Referring to FIGS. 2 and 5, a device isolation layer 26 may include a first portion 26A formed between the N sub-fins 31 to 38, and a second portion 26B formed outside the first multi-fin active 30. An upper end of the second portion 26B may be formed at a lower level than an upper end of the first portion 26A. A side surface of a first impurity area 51 near the second portion 26B may be relatively convex compared to a side surface of the first impurity area 51 near the first portion 26A.

Figure 6:
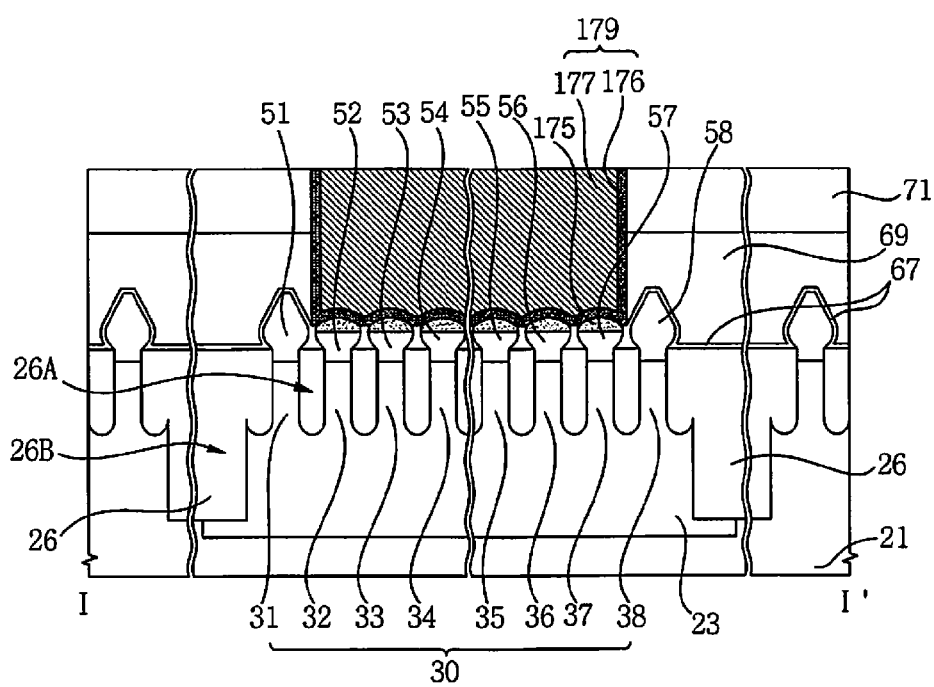

Referring to FIGS. 2 and 6, a device isolation layer 26 may include a first portion 26A formed between the N sub-fins 31 to 38, and a second portion 26B formed outside the first multi-fin active 30. A lower end of the first portion 26A may be rounded.

Figure 7:
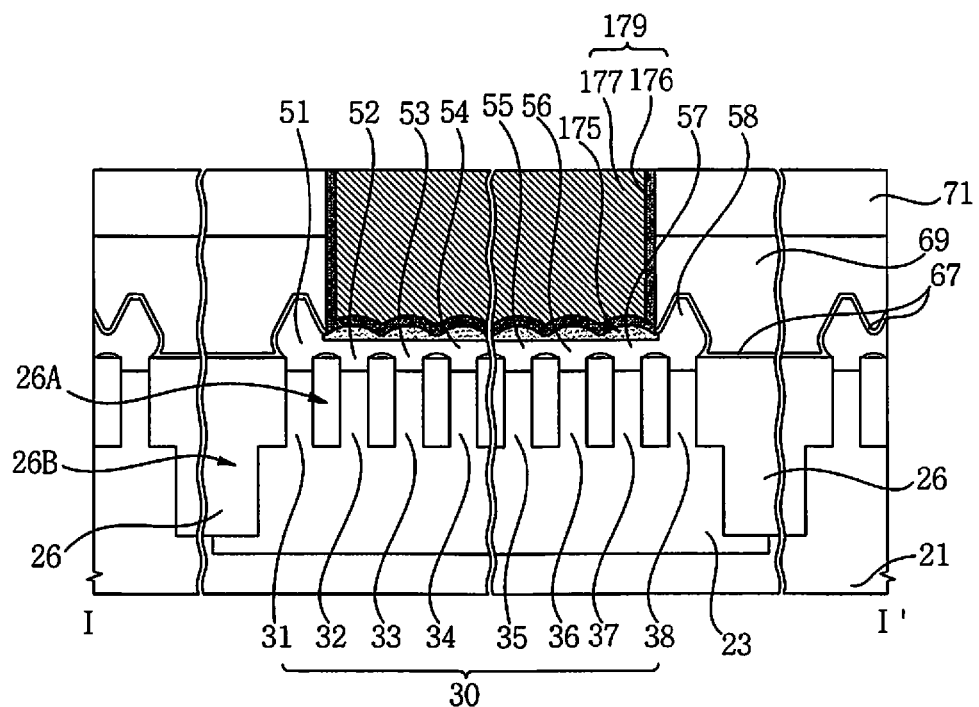

Referring to FIGS. 2 and 7, side surfaces of impurity areas 51 to 58 may be in contact with each other.

Figure 8:
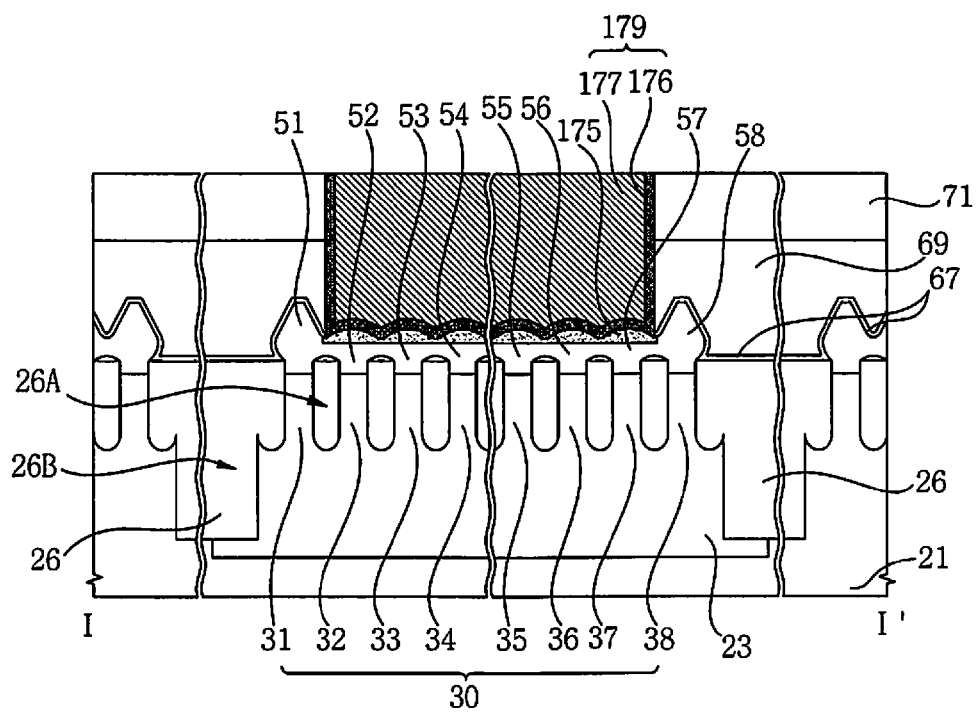

Referring to FIGS. 2 and 8, side surfaces of impurity areas 51 to 58 may be in contact with each other. In addition, a lower end of a first portion 26A of a device isolation layer 26 may be rounded.

Figure 9:
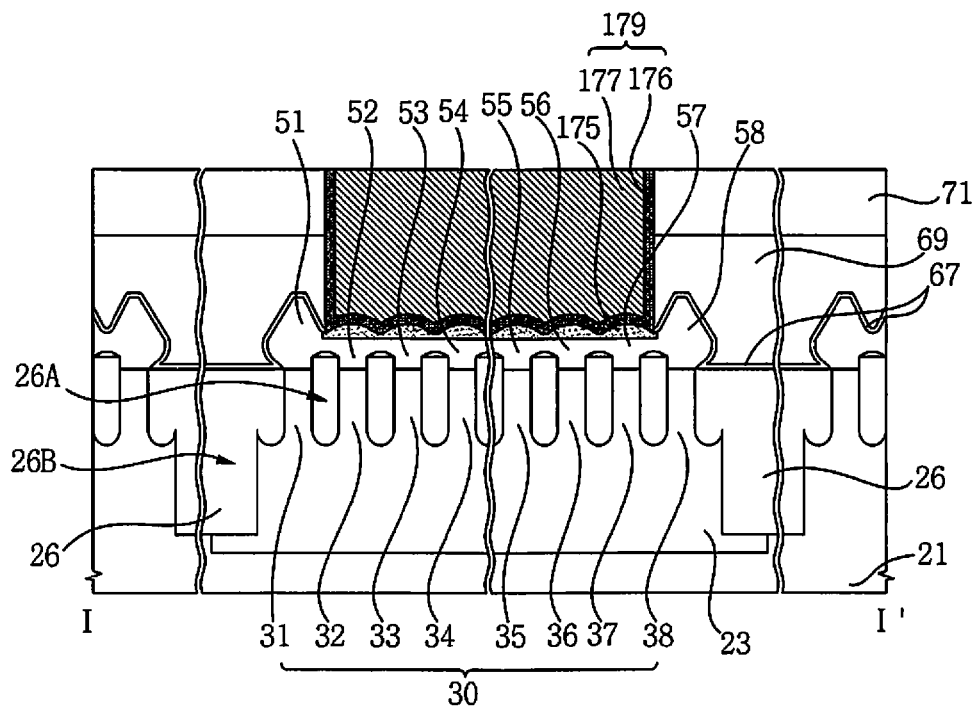

Referring to FIGS. 2 and 9, side surfaces of impurity areas 51 to 58 may be in contact with each other. In addition, a lower end of a first portion 26A of a device isolation layer 26 may be rounded. Further, a side surface of a first impurity area 51 near a second portion 26B of the device isolation layer 26 may be relatively convex compared to a side surface of the first impurity area 51 near the first portion 26A.

Figure 10:
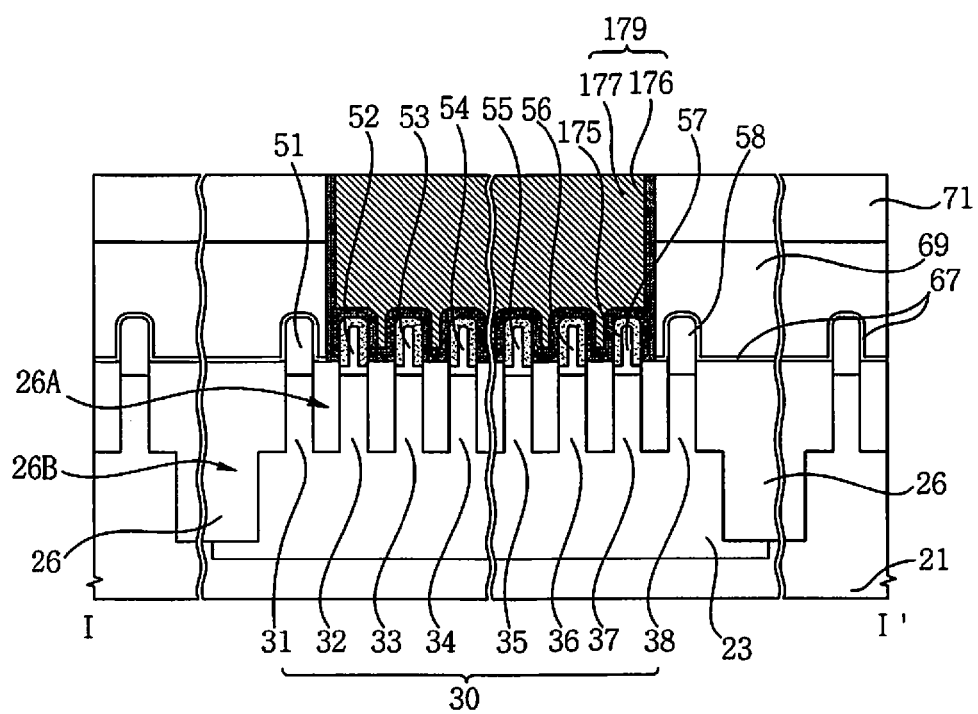

Referring to FIGS. 2 and 10, impurity areas 51 to 58 may be formed by implanting impurities in upper portions of the N sub-fins 31 to 38.

Figure 11:
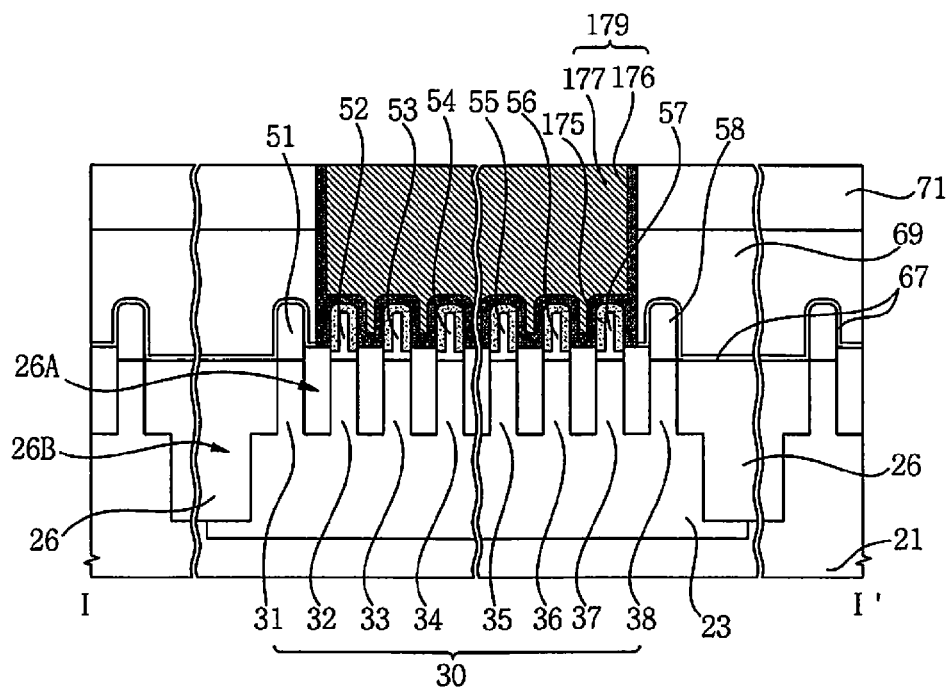

Referring to FIGS. 2 and 11, impurity areas 51 to 58 may be formed by implanting impurities in upper portions of the N sub-fins 31 to 38. A device isolation layer 26 may include a first portion 26A formed between the N sub-fins 31 to 38, and a second portion 26B formed outside the first multi-fin active 30. An upper end of the second portion 26B may be formed at a lower level than an upper end of the first portion 26A.

Figure 12:
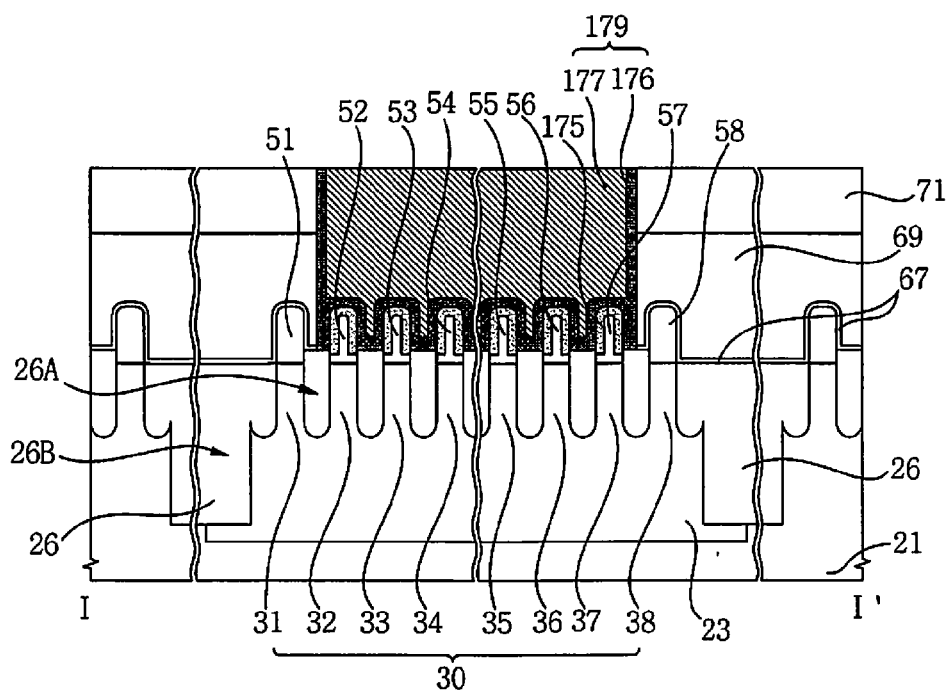

Referring to FIGS. 2 and 12, impurity areas 51 to 58 may be formed by implanting impurities in upper portions of the N sub-fins 31 to 38. An upper end of the second portion 26B of a device isolation layer 26 may be formed at a lower level than an upper end of the first portion 26A of the device isolation layer 26. In addition, a lower end of the first portion 26A of the device isolation layer 26 may be rounded.

Figure 13:
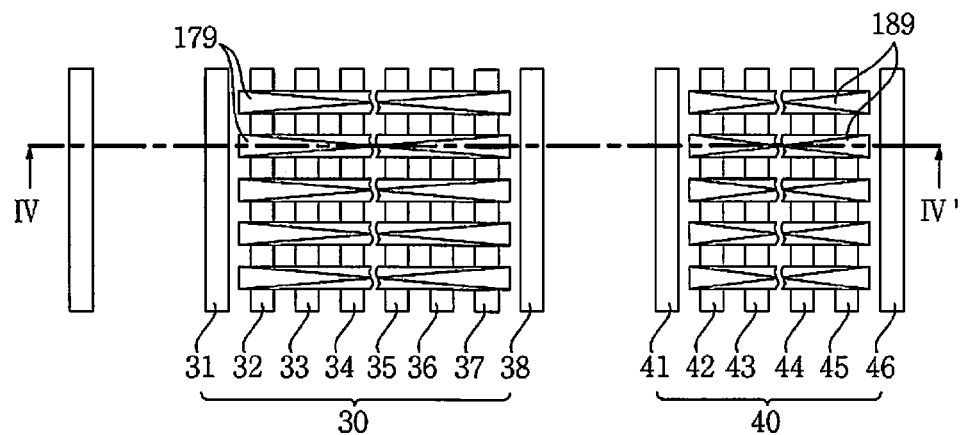
FIG. 13 is a layout for describing a semiconductor device in accordance with an example embodiment of the inventive concepts.

FIG. 13 is a layout describing a semiconductor device in accordance with an example embodiment of the inventive concepts. The semiconductor device in accordance with the example embodiment of the inventive concepts may be a diode.

Referring to FIG. 13, a first multi-fin active 30, a second multi-fin active 40, first contact plugs 179, and second contact plugs 189 may be formed. The first multi-fin active 30 may include a first sub-fin 31, a second sub-fin 32, a third sub-fin 33, a fourth sub-fin 34, an $(N-3)^{th}$ sub-fin 35, an $(N-2)^{th}$ sub-fin 36, an $(N-1)^{th}$ sub-fin 37, and an $N^{th}$ sub-fin 38. The second multi-fin active 40 may include M sub-fins 41 to 46. The second multi-fin active 40 may include a first sub-fin 41, a second sub-fin 42, a third sub-fin 43, an $(M-2)^{th}$ sub-fin 44, an $(M-1)^{th}$ sub-fin 45, and an $M^{th}$ sub-fin 46. Each of N and M may be an integer greater than about eight (8) and smaller than about one thousand (1000).

The first contact plugs 179 may be substantially parallel to each other. The first to $N^{th}$ sub-fins 31 to 38 of the first multi-fin active 30 may be substantially parallel to each other. The first contact plugs 179 may cross the second to $(N-1)^{th}$ sub-fins 32 to 37 of the first multi-fin active 30. The first sub-fin 31 and the $N^{th}$ sub-fin 38 of the first multi-fin active 30 may be disposed outside the first contact plugs 179. The first sub-fin 31 and the $N^{th}$ sub-fin 38 of the first multi-fin active 30 may be configured so as not to overlap the first contact plugs 179.

The second contact plugs 189 may be substantially parallel to each other. The first to $M^{th}$ sub-fins 41 to 46 of the second multi-fin active 40 may be substantially parallel to each other. The second contact plugs 189 may cross the second to $(M-1)^{th}$ sub-fins 42 to 45 of the second multi-fin active 40. The first sub-fin 41 and the $M^{th}$ sub-fin 46 of the second multi-fin active 40 may be disposed outside the second contact plugs 189. The first sub-fin 41 and the $M^{th}$ sub-fin 46 of the second multi-fin active 40 may be configured so as not to overlap the second contact plugs 189.

The first contact plugs 179 may correspond to a first electrode of a diode, and the second contact plugs 189 may correspond to a second electrode of the diode.

Figure 14:
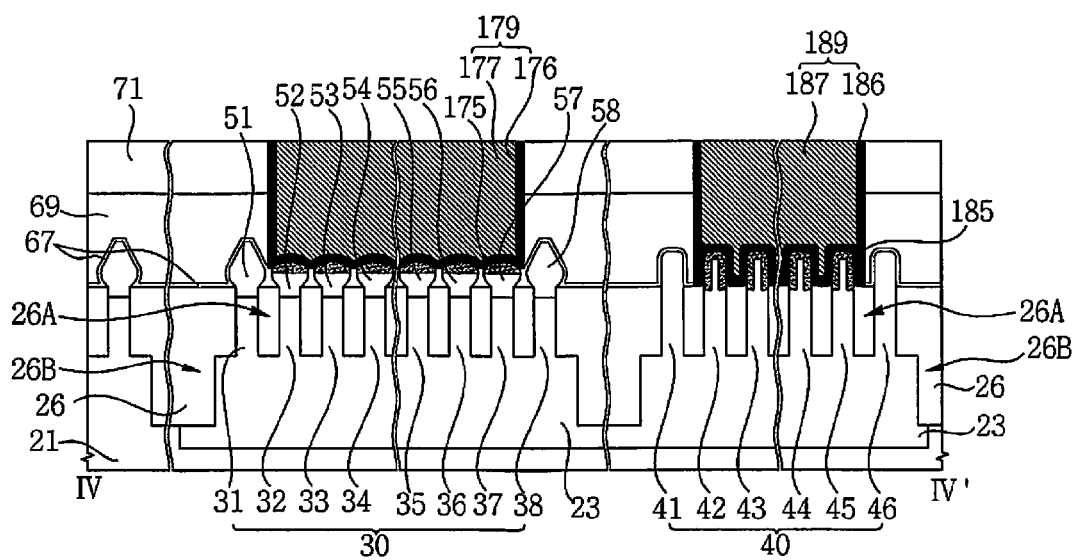
FIGS. 14 and 15 are cross-sectional views for describing semiconductor devices in accordance with example embodiments of the inventive concepts.
Figure 15:
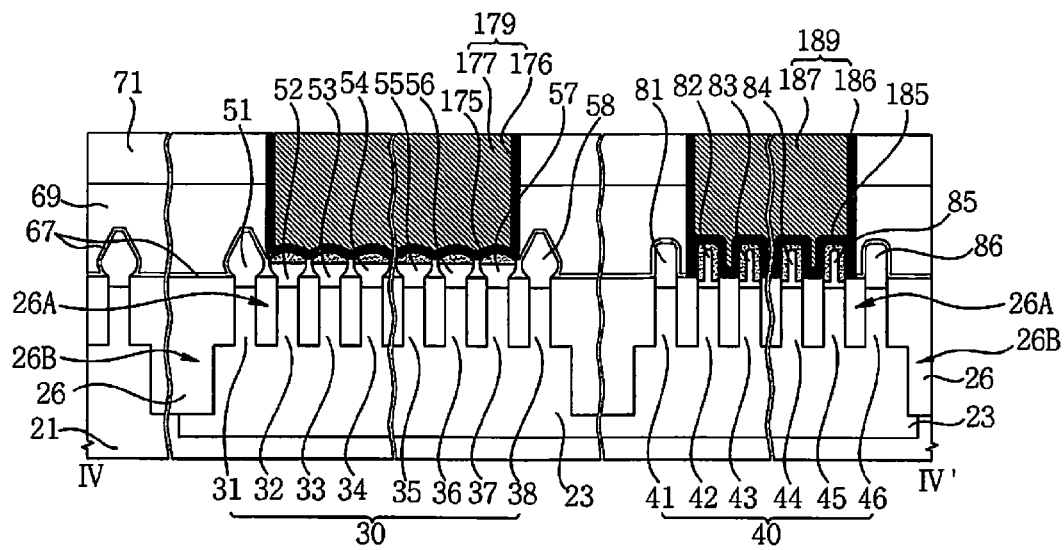

FIGS. 14 and 15 are cross-sectional views taken along line IV-IV' of FIG. 13, for describing semiconductor devices in accordance with example embodiments of the inventive concepts.

Referring to FIGS. 13 and 14, a well 23, a device isolation layer 26, a first multi-fin active 30, a second multi-fin active 40, impurity areas 51 to 58, an etch stop layer 67, a lower insulating layer 69, an upper insulating layer 71, a first metal silicide layer 175, a second metal silicide layer 185, a first contact plug 179, and a second contact plug 189 may be formed on a substrate 21. The first contact plug 179 may include a first barrier layer 176 and a first conductive layer 177. The second contact plug 189 may include a second barrier layer 186 and a second conductive layer 187.

The device isolation layer 26 may include a first portion 26A and a second portion 26B. The first portion 26A of the device isolation layer 26 may be formed between N sub-fins 31 to 38 of the first multi-fin active 30, and between the M sub-fins 41 to 46 of the second multi-fin active 40. The second portion 26B of the device isolation layer 26 may be formed outside the first multi-fin active 30 and the second multi-fin active 40. A lower end of the second portion 26B may be formed at a lower level than a lower end of the first portion 26A.

The second multi-fin active 40 may be spaced apart from the first multi-fin active 30 in the well 23.

The second multi-fin active 40 may be a semiconductor layer including the same conductivity type impurities as the well 23. For example, each of the M sub-fins 41 to 46 may be a silicon layer including the first conductivity type impurities. Each of the M sub-fins 41 to 46 may have a line shape or a bar shape in a plan view. Each of the M sub-fins 41 to 46 may have a vertical height greater than a horizontal width in a cross-sectional view. The M sub-fins 41 to 46 may be substantially parallel to each other. The first sub-fin 41 and the $M^{th}$ sub-fin 46 may be formed on outermost sides of the second multi-fin active 40. The second to $(M-1)^{th}$ sub-fins 42 to 45 may be sequentially formed between the first sub-fin 41 and the $M^{th}$ sub-fin 46.

The etch stop layer 67 may cover the impurity areas 51 to 58, the M sub-fins 41 to 46, and the device isolation layer 26.

The second metal silicide layer 185 may be formed on the second to $(M-1)^{th}$ sub-fins 42 to 45. The second contact plug 189 may pass through the upper insulating layer 71, the lower insulating layer 69, and the etch stop layer 67 to be connected to the second to $(M-1)^{th}$ sub-fins 42 to 45. The second barrier layer 186 may surround a bottom and side surfaces of the second conductive layer 187. The second barrier layer 186 may include Ti, TiN, Ta, TaN, or a combination thereof. The second conductive layer 187 may include W, WN, Ru, Al, Cu, conductive carbon, or a combination thereof.

A straight line passing along a side surface of the second contact plug 189 and substantially perpendicular to the substrate 21 may pass between the first sub-fin 41 and the second sub-fin 42, or through the second sub-fin 42. For example, the straight line passing along the side surface of the second contact plug 189 and substantially perpendicular to the substrate 21 may be aligned between the first sub-fin 41 and the second sub-fin 42. The second contact plug 189 may cover the second to $(M-1)^{th}$ sub-fins 42 to 45. The first sub-fin 41 and the $M^{th}$ sub-fin 46 may be formed outside the first contact plug 179. The first sub-fin 41 and the $M^{th}$ sub-fin 46 may be configured so as not to overlap the second contact plug 189.

The second metal silicide layer 185 may be aligned below the second contact plug 189. The second metal silicide layer 185 may be selectively formed on the second to $(M-1)^{th}$ sub-fins 42 to 45. The second metal silicide layer 185 may be configured so as not to be formed on the first sub-fin 41 and the $M^{th}$ sub-fin 46. The second contact plug 189 may be in direct contact with the second metal silicide layer 185.

Referring to FIGS. 13 and 15, impurity areas 51 to 58 and 81 to 86 may be formed. The impurity areas 51 to 58 and 81 to 86 may include a first impurity area 51, a second impurity area 52, a third impurity area 53, a fourth impurity area 54, a fifth impurity area 55, a sixth impurity area 56, a seventh impurity area 57, an eighth impurity area 58, and a ninth impurity area 81 formed on the first sub-fin 41 of the second multi-fin active 40, a tenth impurity area 82 formed on the second sub-fin 42 of the second multi-fin active 40, an eleventh impurity area 83 formed on the third sub-fin 43 of the second multi-fin active 40, a twelfth impurity area 84 formed on the $(M-2)^{th}$ sub-fin 44 of the second multi-fin active 40, a thirteenth impurity area 85 formed on the $(M-1)^{th}$ sub-fin 45 of the second multi-fin active 40, and a fourteenth impurity area 86 formed on the $M^{th}$ sub-fin 46 of the second multi-fin active 40.

The ninth to fourteenth impurity areas 81 to 86 may be formed by implanting impurities in upper portions of the M sub-fins 41 to 46. The ninth to fourteenth impurity areas 81 to 86 each may be a semiconductor layer including different conductivity type impurities from the second multi-fin active 40 and the well 23. For example, each of the ninth to fourteenth impurity areas 81 to 86 may be a silicon layer including second conductivity type impurities.

In another example embodiment, the ninth to fourteenth impurity areas 81 to 86 each may be a semiconductor layer including the same conductivity type impurities as the second multi-fin active 40 and the well 23. For example, each of the ninth to fourteenth impurity areas 81 to 86 may be a silicon layer including the first conductivity type impurities.

The second metal silicide layer 185 may be selectively formed on the tenth to thirteenth impurity areas 82 to 85.

Figure 16:
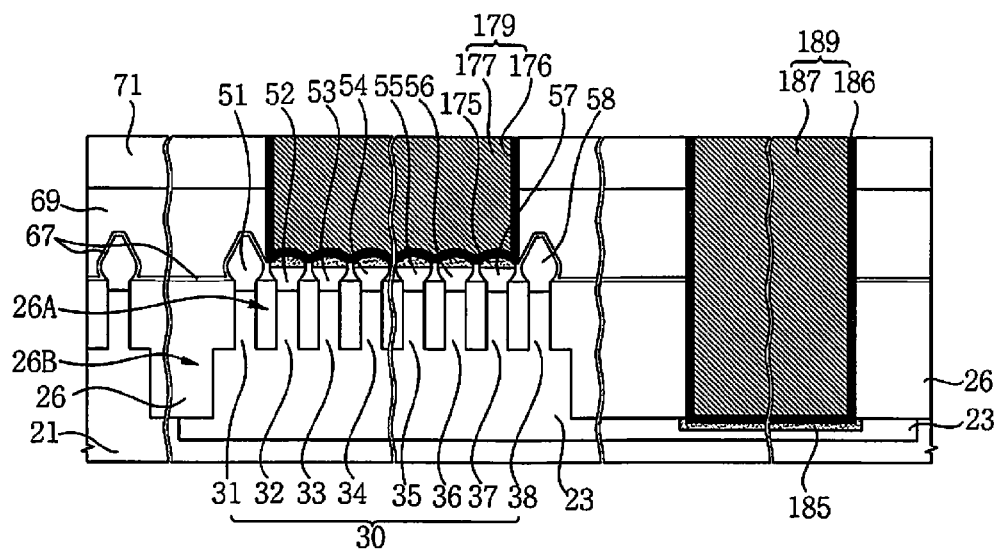
FIG. 16 is a layout for describing a semiconductor device in accordance with an example embodiment of the inventive concepts.

FIG. 16 is a cross-sectional view for describing a semiconductor device in accordance with an example embodiment of the inventive concepts.

Referring to FIG. 16, a second contact plug 189 may pass through an upper insulating layer 71, a lower insulating layer 69, an etch stop layer 67, and a device isolation layer 26 to be connected to a well 23. A second metal silicide layer 185 may be formed between the well 23 and the second contact plug 189. The second metal silicide layer 185 may be selectively formed below the second contact plug 189.

FIGS. 17 to 22 are cross-sectional views taken along line IV-IV' of FIG. 13, for describing semiconductor devices in accordance with example embodiments of the inventive concepts.

Figure 17:
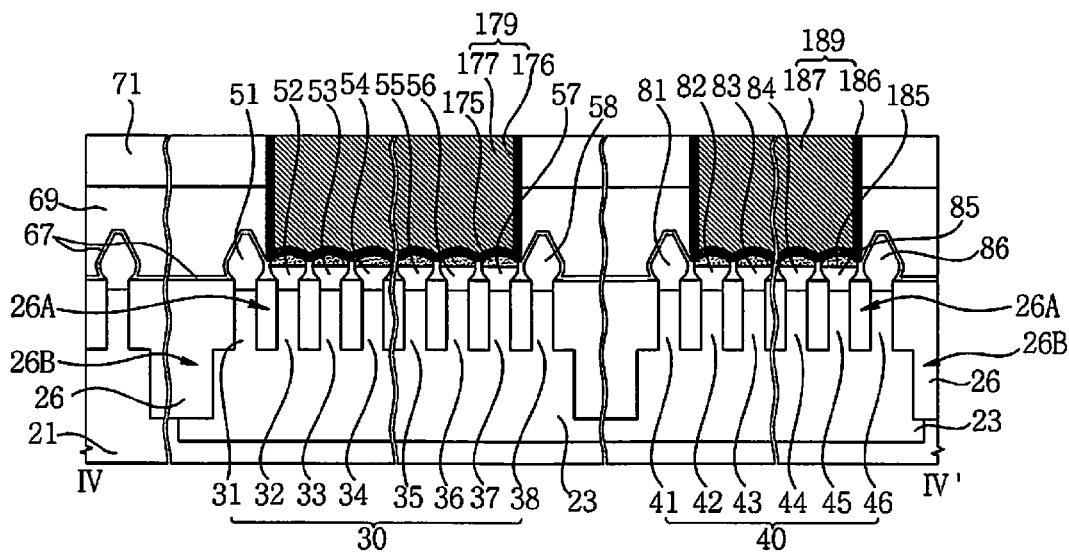
FIGS. 17 to 22 are cross-sectional views for describing semiconductor devices in accordance with example embodiments of the inventive concepts.

Referring to FIGS. 13 and 17, ninth to fourteenth impurity areas 81 to 86 may be formed on the M sub-fins 41 to 46. The ninth to fourteenth impurity areas 81 to 86 may include a crystal growth material. The ninth to fourteenth impurity areas 81 to 86 each may be a semiconductor layer including different conductivity type impurities from the second multi-fin active 40 and a well 23.

In another example embodiment, the ninth to fourteenth impurity areas 81 to 86 each may be a semiconductor layer including the same conductivity type impurities as the second multi-fin active 40 and the well 23.

A second metal silicide layer 185 may be selectively formed on the tenth impurity area 82 to the thirteenth impurity area 85.

Figure 18:
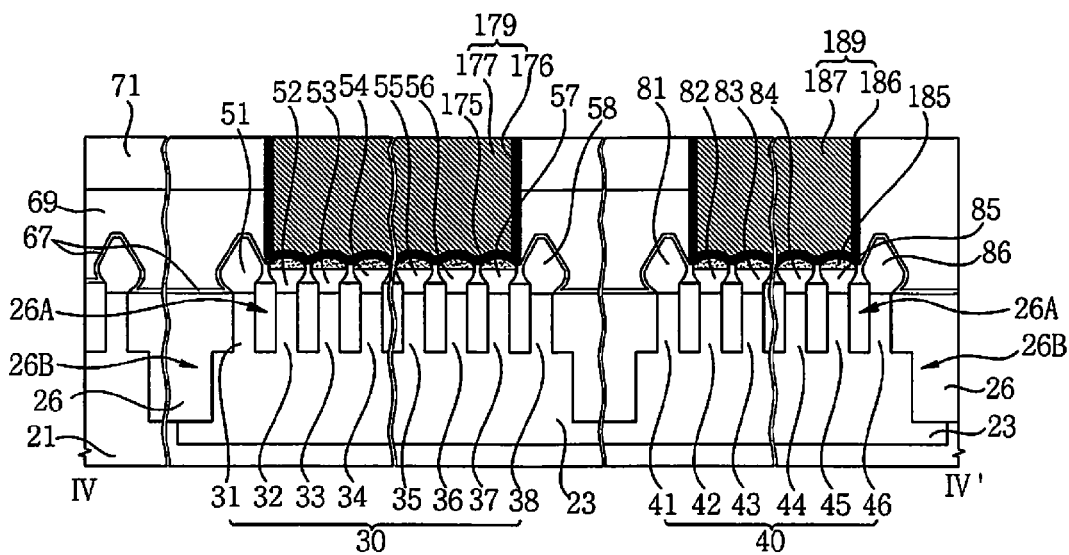

Referring to FIGS. 13 and 18, a device isolation layer 26 may include a first portion 26A formed between the N sub-fins 31 to 38 of the first multi-fin active 30 and between the M sub-fins 41 to 46 of the second multi-fin active 40, and a second portion 26B formed outside the first multi-fin active 30 and outside the second multi-fin active 40. An upper end of the second portion 26B may be formed at a lower level than an upper end of the first portion 26A. A side surface of the ninth impurity area 81 disposed near the second portion 26B may be relatively convex compared to a side surface of the ninth impurity area 81 disposed near the first portion 26A.

Figure 19:
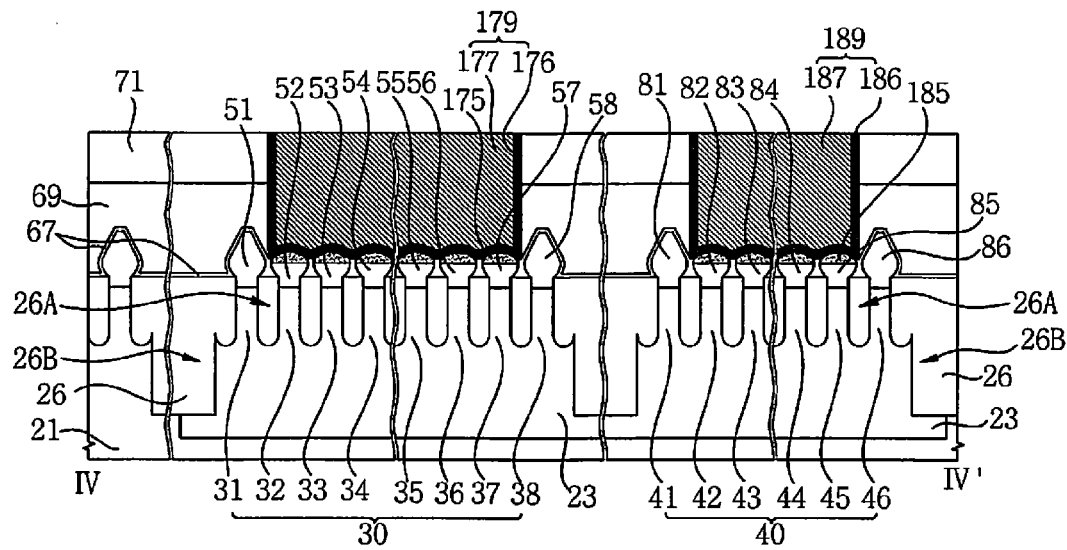

Referring to FIGS. 13 and 19, a lower end of a first portion 26A of a device isolation layer 26 may be rounded.

Figure 20:
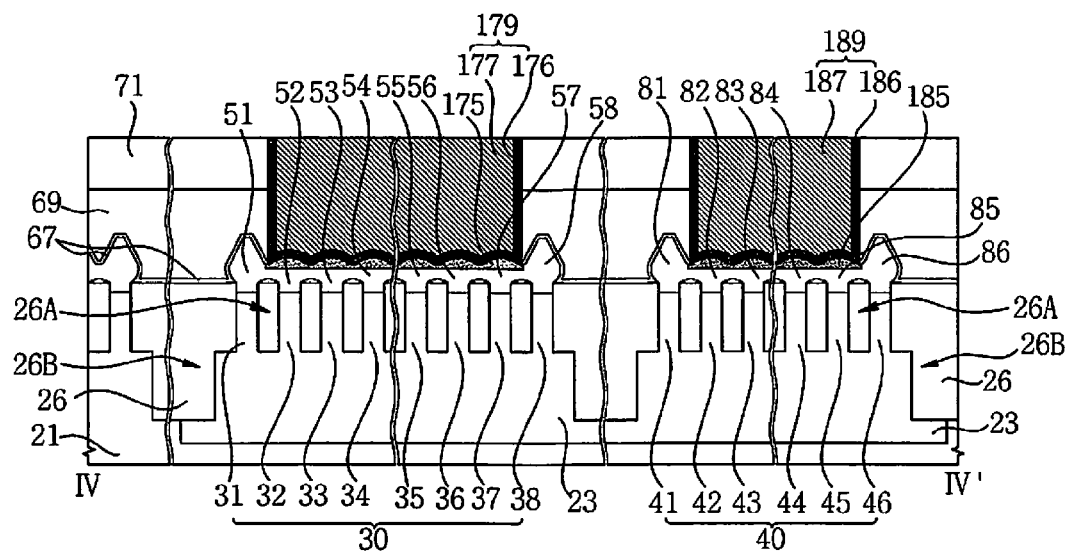

Referring to FIGS. 13 and 20, side surfaces of ninth to fourteenth impurity areas 81 to 86 may be in contact with each other.

Figure 21:
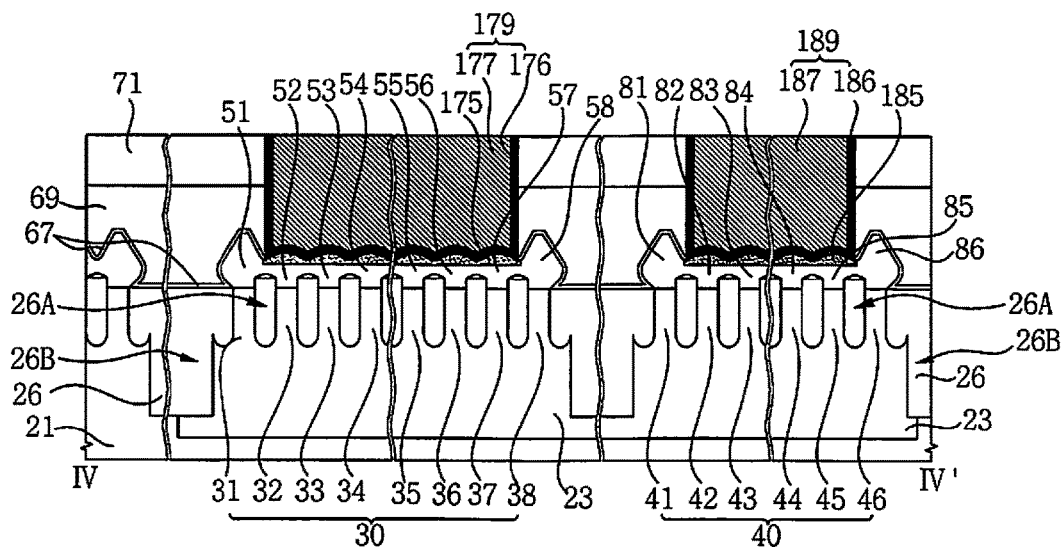

Referring to FIGS. 13 and 21, side surfaces of ninth to fourteenth impurity areas 81 to 86 may be in contact with each other. A lower end of a first portion 26A of a device isolation layer 26 may be rounded. A side surface of the ninth impurity area 81 disposed near a second portion 26B may be relatively convex compared to a side surface of the ninth impurity area 81 near the first portion 26A.

Figure 22:
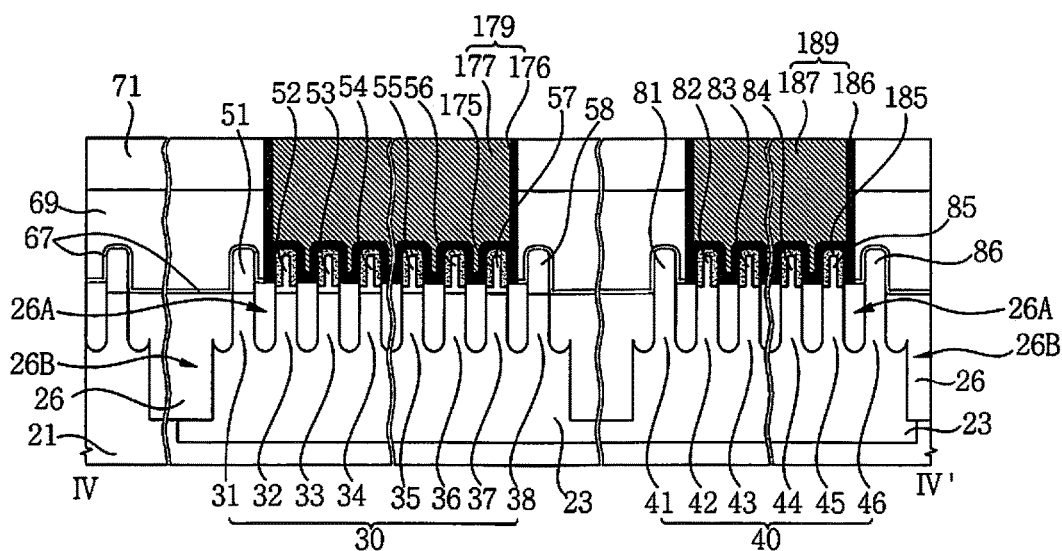

Referring to FIGS. 13 and 22, first to eighth impurity areas 51 to 58 may be formed by implanting impurities in upper portions of the N sub-fins 31 to 38. An upper end of a second portion 26B of a device isolation layer 26 may be formed at a lower level than an upper end of a first portion 26A of the device isolation layer 26. A lower end of the first portion 26A of the device isolation layer 26 may be rounded. A second metal silicide layer 185 may be formed on the second to (M−1)$^{th}$ sub-fins 42 to 45.

Figure 23:
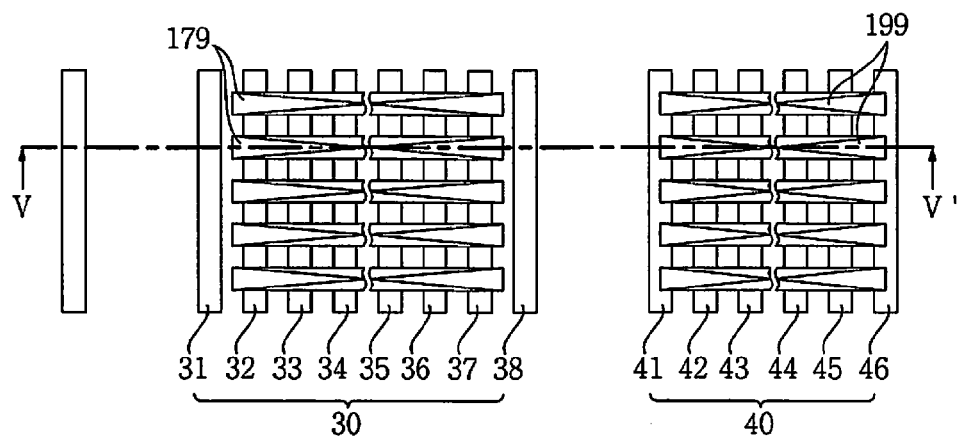
FIG. 23 is a layout for describing a semiconductor device in accordance with an example embodiment of the inventive concepts.

FIG. 23 is a layout for describing a semiconductor device in accordance with an example embodiment of the inventive concepts. FIGS. 24 to 30 are cross-sectional views taken along line V-V' of FIG. 23, for describing semiconductor devices in accordance with example embodiments of the inventive concepts. The semiconductor device in accordance with the example embodiments of the inventive concepts may be a diode.

Figure 24:
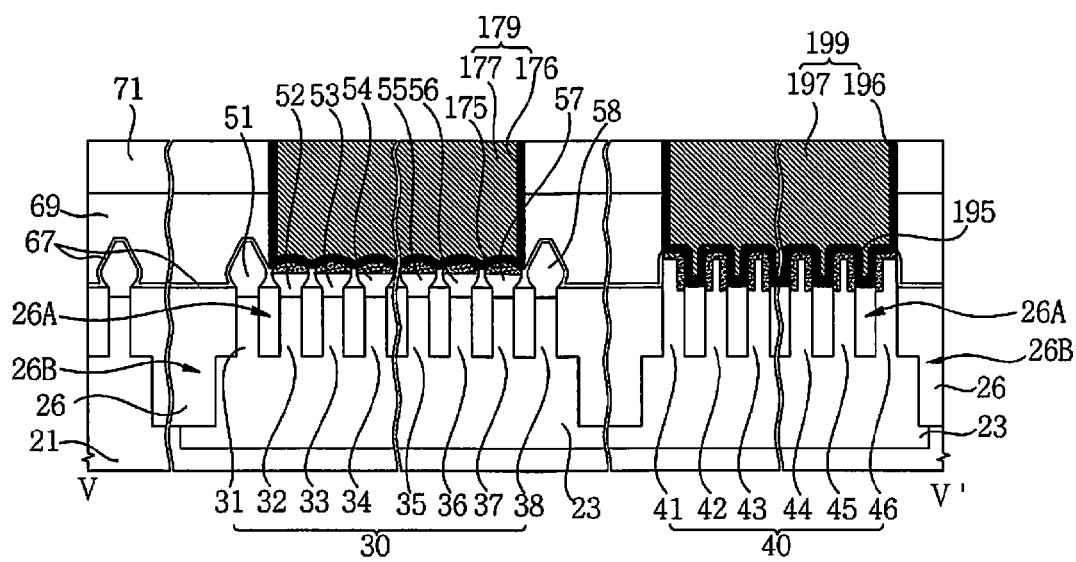
FIGS. 24 to 30 are cross-sectional views for describing semiconductor devices in accordance with example embodiments of the inventive concepts.

Referring to FIGS. 23 and 24, a first multi-fin active 30, a second multi-fin active 40, first contact plugs 179, and second contact plugs 199 may be formed. The first multi-fin active 30 may include a first sub-fin 31, a second sub-fin 32, a third sub-fin 33, a fourth sub-fin 34, an (N−3)$^{th}$ sub-fin 35, an (N−2)$^{th}$ sub-fin 36, an (N−1)$^{th}$ sub-fin 37, and an N$^{th}$ sub-fin 38. The second multi-fin active 40 may include M sub-fins 41 to 46. The second multi-fin active 40 may include a first sub-fin 41, a second sub-fin 42, a third sub-fin 43, an (M−2)$^{th}$ sub-fin 44, an (M−1)$^{th}$ sub-fin 45, and an M$^{th}$ sub-fin 46. Each of N and M may be an integer greater than about eight (8) and smaller than about one thousand (1000).

The second contact plugs 199 may be substantially parallel to each other. The first to M$^{th}$ sub-fins 41 to 46 of the second multi-fin active 40 may be substantially parallel to each other. The second contact plugs 199 may be formed on the first to M$^{th}$ sub-fins 41 to 46 of the second multi-fin active 40.

The first contact plugs 179 may correspond to a first electrode of a diode, and the second contact plugs 199 may correspond to a second electrode of the diode.

The second contact plug 199 may include a second barrier layer 196 and a second conductive layer 197.

A second metal silicide layer 195 may be formed on the first to M$^{th}$ sub-fins 41 to 46. The second contact plugs 199 may pass through an upper insulating layer 71, a lower insulating layer 69, and an etch stop layer 67 to be connected to the first to M$^{th}$ sub-fins 41 to 46.

Figure 25:
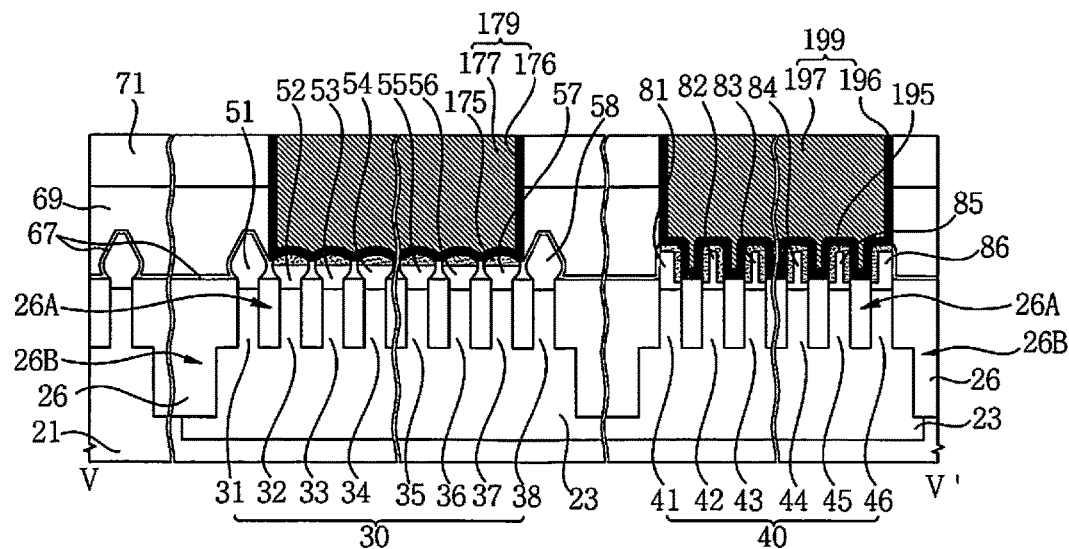

Referring to FIGS. 23 and 25, ninth to fourteenth impurity areas 81 to 86 may be formed by implanting impurities in upper portions of the M sub-fins 41 to 46. A second metal silicide layer 195 may be selectively formed on the ninth to fourteenth impurity areas 81 to 86.

Figure 26:
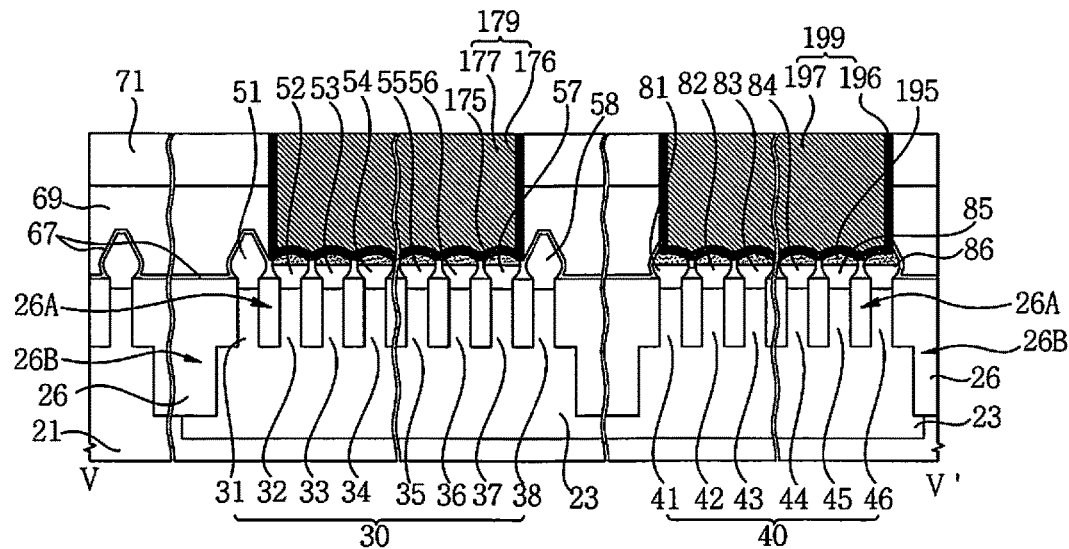

Referring to FIGS. 23 and 26, ninth to fourteenth impurity areas 81 to 86 may be formed on the M sub-fins 41 to 46. The ninth to fourteenth impurity areas 81 to 86 may include a crystal growth material. A second metal silicide layer 195 may be selectively formed on the ninth to fourteenth impurity areas 81 to 86.

Figure 27:
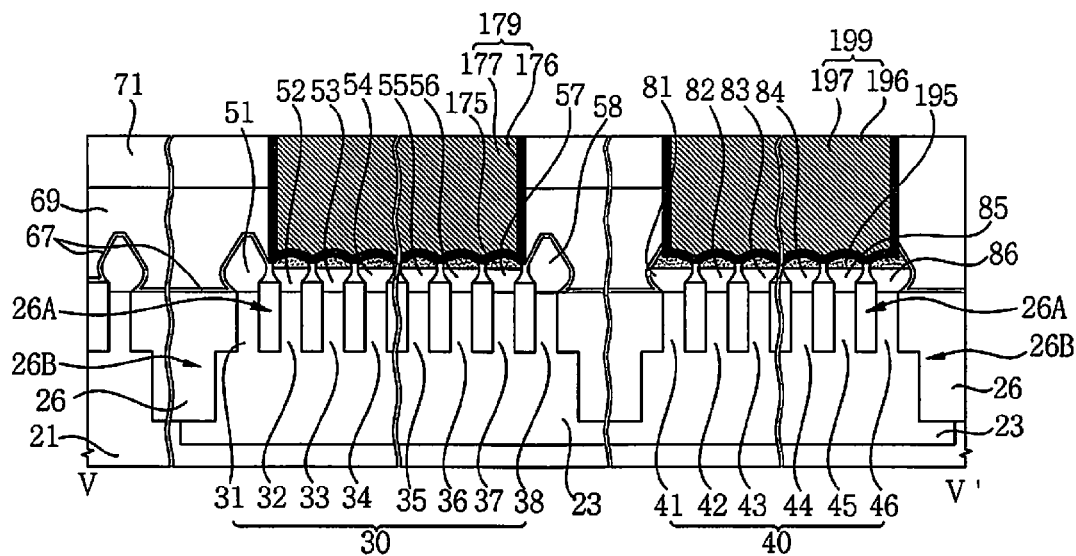

Referring to FIGS. 23 and 27, a side surface of a ninth impurity area 81 near a second portion 26B of a device isolation layer 26 may be relatively convex compared to a side surface of the ninth impurity area 81 near a first portion 26A of the device isolation layer 26. A second metal silicide layer 195 may be selectively formed on the ninth impurity area 81 to the fourteenth impurity area 86.

Figure 28:
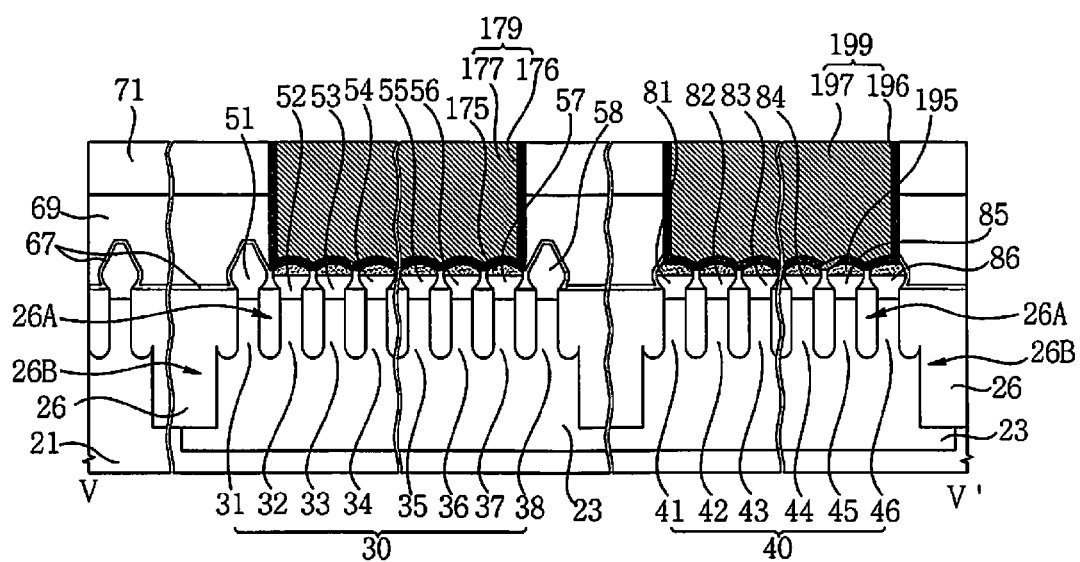

Referring to FIGS. 23 and 28, a lower end of a first portion 26A of a device isolation layer 26 may be rounded.

Figure 29:
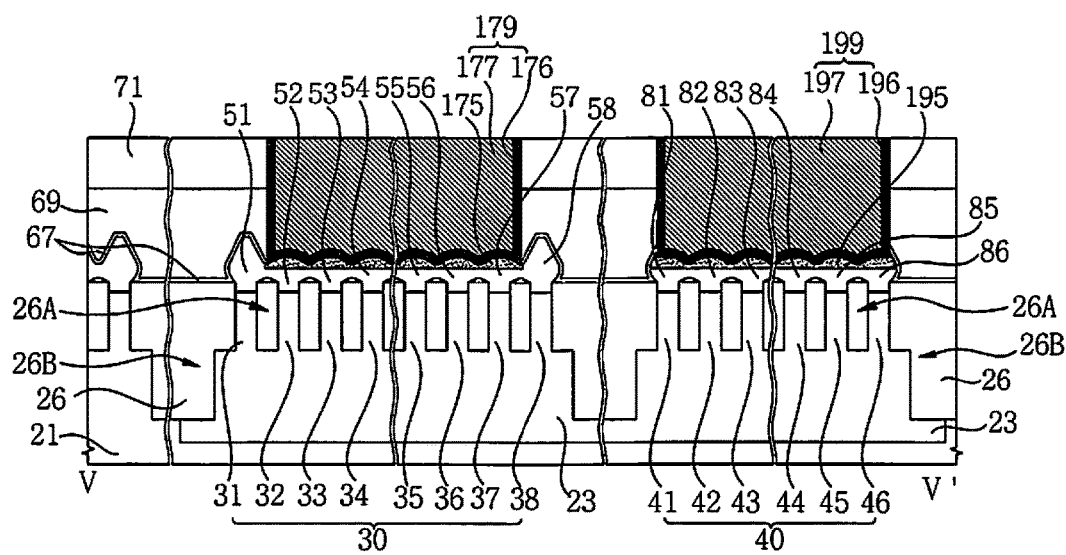

Referring to FIGS. 23 and 29, side surfaces of ninth to fourteenth impurity areas 81 to 86 may be in contact with each other.

Figure 30:
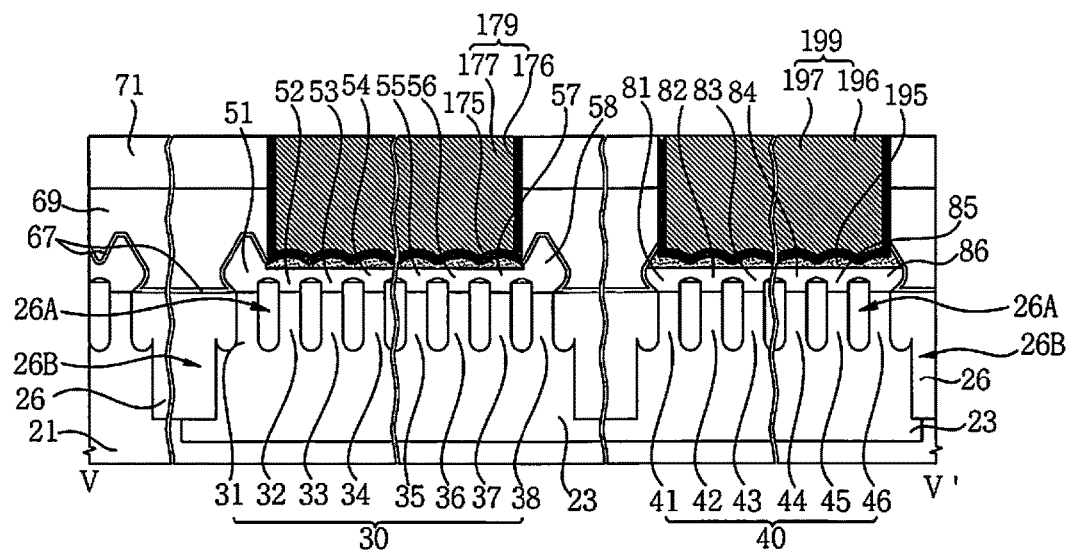

Referring to FIGS. 23 and 30, side surfaces of ninth to fourteenth impurity areas 81 to 86 may be in contact with each other. A lower end of a first portion 26A of a device isolation layer 26 may be rounded. A side surface of the ninth impurity area 81 near a second portion 26B of the device isolation layer 26 may be relatively convex compared to a side surface of the ninth impurity area 81 near the first portion 26A of the device isolation layer 26.

FIGS. 31 to 38 are cross-sectional views for describing a method of fabricating a semiconductor device in accordance with an example embodiment of the inventive concepts.

Figure 35:
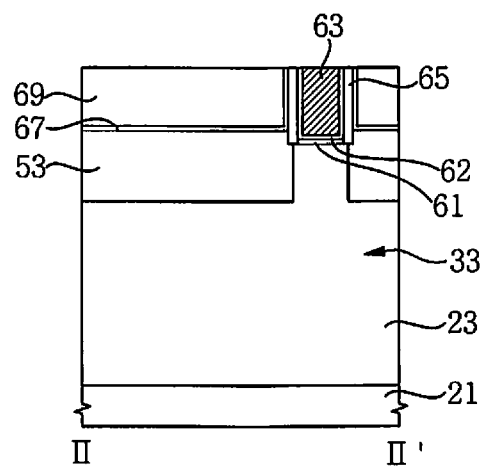
Figure 36:
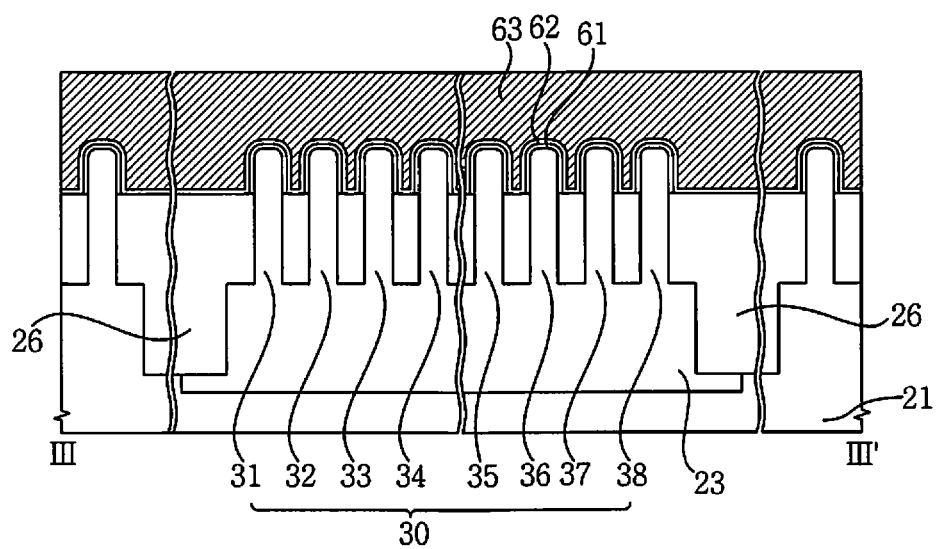
Figure 37:
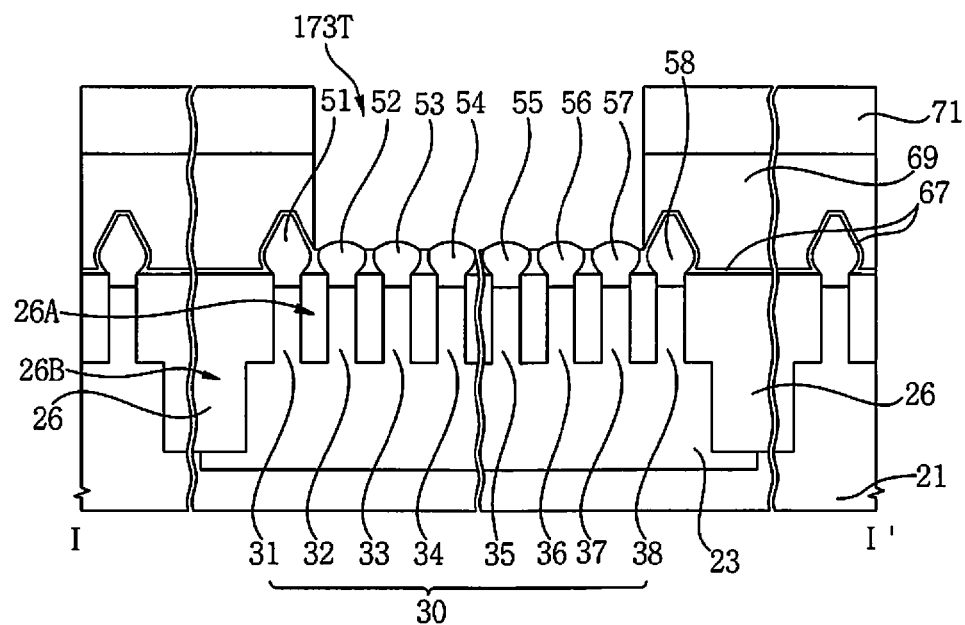
Figure 38:
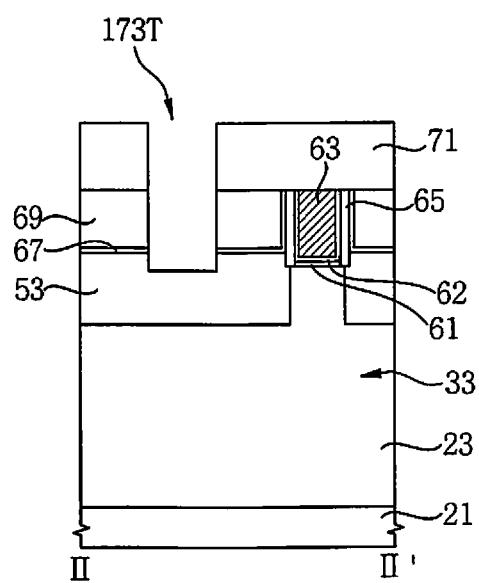

FIGS. 31 to 34, and FIG. 37 are cross-sectional views taken along line I-I' of FIG. 2, for describing the method of fabricating a semiconductor device in accordance with the example embodiment of the inventive concepts, FIGS. 35 and 38 are cross-sectional views taken along line II-II' of FIG. 2, and FIG. 36 is a cross-sectional view taken along line III-III' of FIG. 2.

Figure 31:
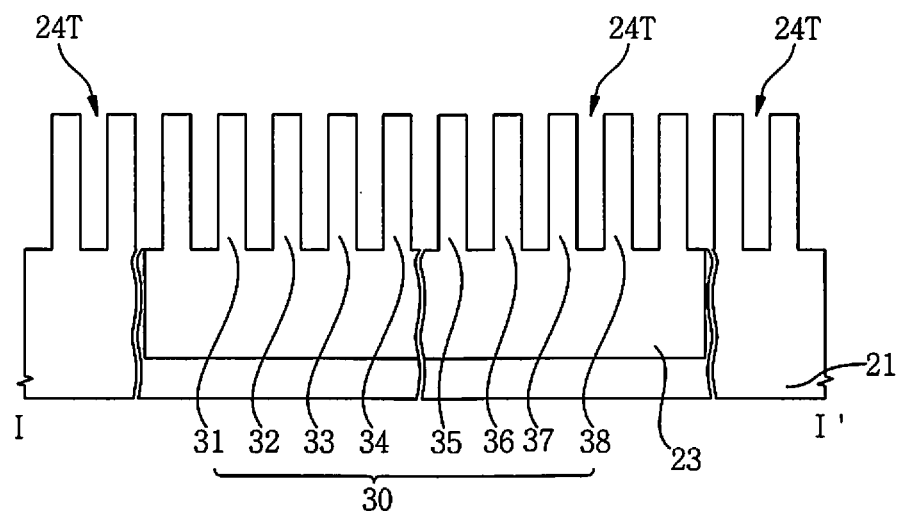
FIGS. 31 to 38 are cross-sectional views for describing a method of fabricating a semiconductor device in accordance with an example embodiment of the inventive concepts.

Referring to FIGS. 2 and 31, a well 23 may be formed in a desired, or alternatively predetermined, region of a substrate 21. Upper trenches 24T may be formed by patterning the substrate 21. A first multi-fin active 30 including N sub-fins 31 to 38 may be formed in the well 23 due to the upper trenches 24T.

Figure 32:
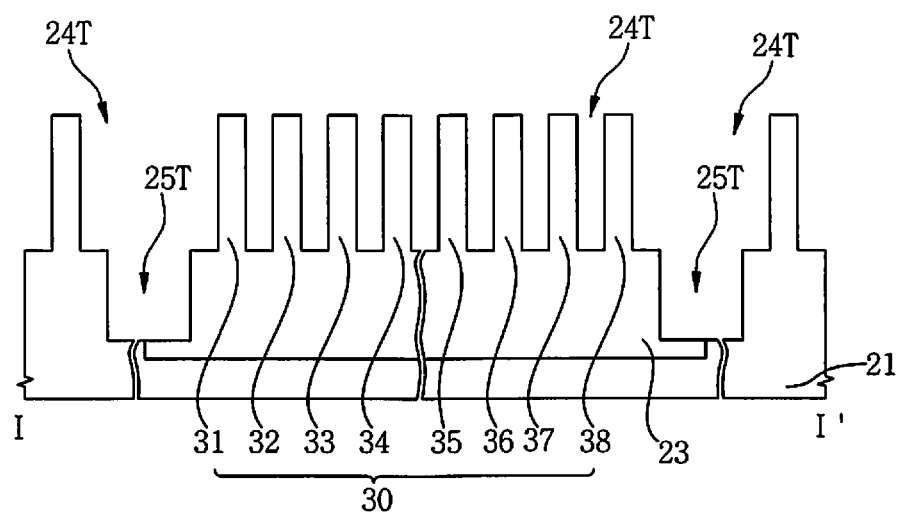

Referring to FIGS. 2 and 32, lower trenches 25T may be formed by patterning the substrate 21. Bottoms of the lower trenches 25T may be formed at a lower level than bottoms of the upper trenches 24T. The lower trenches 25T may be formed outside the first multi-fin active 30.

Figure 33:
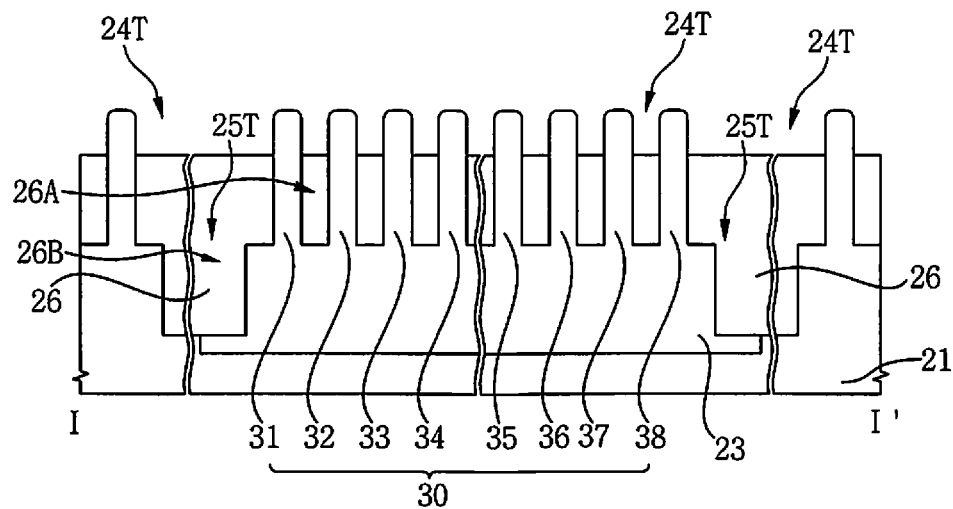
Figure 34:
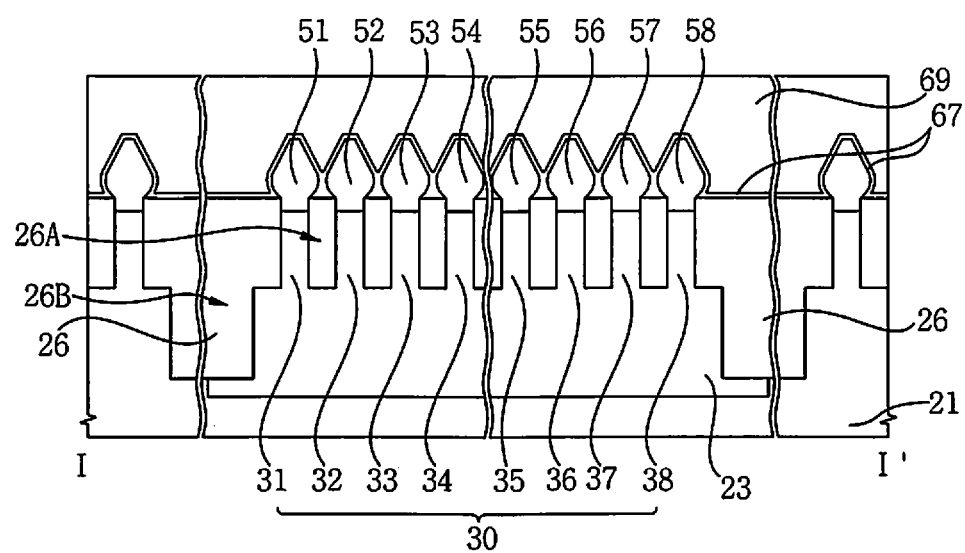

Referring to FIGS. 2 and 33, a device isolation layer 26 may be formed in the lower trenches 25T and the upper trenches 24T. An upper end of the device isolation layer 26 may be formed at a lower level than upper ends of the N sub-fins 31 to 38. Upper surfaces and side surfaces of the N sub-fins 31 to 38 may protrude to a higher level than the device isolation layer 26. The upper edges of the N sub-fins 31 to 38 may be rounded.

The device isolation layer 26 may include a first portion 26A and a second portion 26B. The first portion 26A of the device isolation layer 26 may be formed between the N sub-fins 31 to 38 of the first multi-fin active 30. The second portion 26B of the device isolation layer 26 may be formed outside the first multi-fin active 30. A lower end of the second portion 26B may be formed at a lower level than a lower end of the first portion 26A. A horizontal width of the second portion 26B may be greater than a horizontal width of the first portion 26A.

Referring to FIG. 2 and FIGS. 34 to 36, impurity areas 51 to 58, a lower gate dielectric layer 61, an upper gate dielectric layer 62, a gate electrode 63, a spacer 65, an etch stop layer 67, and a lower insulating layer 69 may be formed. The impurity areas 51 to 58 may include a first impurity area 51 formed on the first sub-fin 31, a second impurity area 52 formed on the second sub-fin 32, a third impurity area 53 formed on the third sub-fin 33, a fourth impurity area 54 formed on the fourth sub-fin 34, a fifth impurity area 55 formed on the $(N-3)^{th}$ sub-fin 35, a sixth impurity area 56 formed on the $(N-2)^{th}$ sub-fin 36, a seventh impurity area 57 formed on the $(N-1)^{th}$ sub-fin 37, and an eighth impurity area 58 formed on the $N^{th}$ sub-fin 38.

Referring to FIGS. 2, 4, 37, and 38, an upper insulating layer 71 may be formed. A contact hole 173T passing through the upper insulating layer 71, the lower insulating layer 69, and the etch stop layer 67 to expose the second to seventh impurity areas 52 to 57 may be formed.

Referring again to FIGS. 1 to 4, a first metal silicide layer 175 and a first contact plug 179 may be formed in the contact hole 173T.

Figure 39:
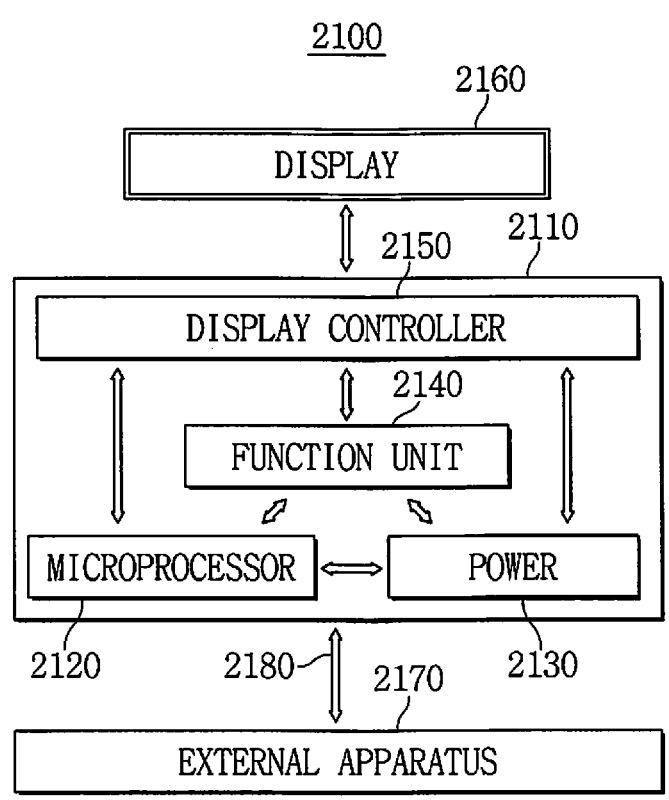
FIGS. 39 and 40 are system block diagrams of electronic apparatuses in accordance with example embodiments of the inventive concepts.
Figure 40:
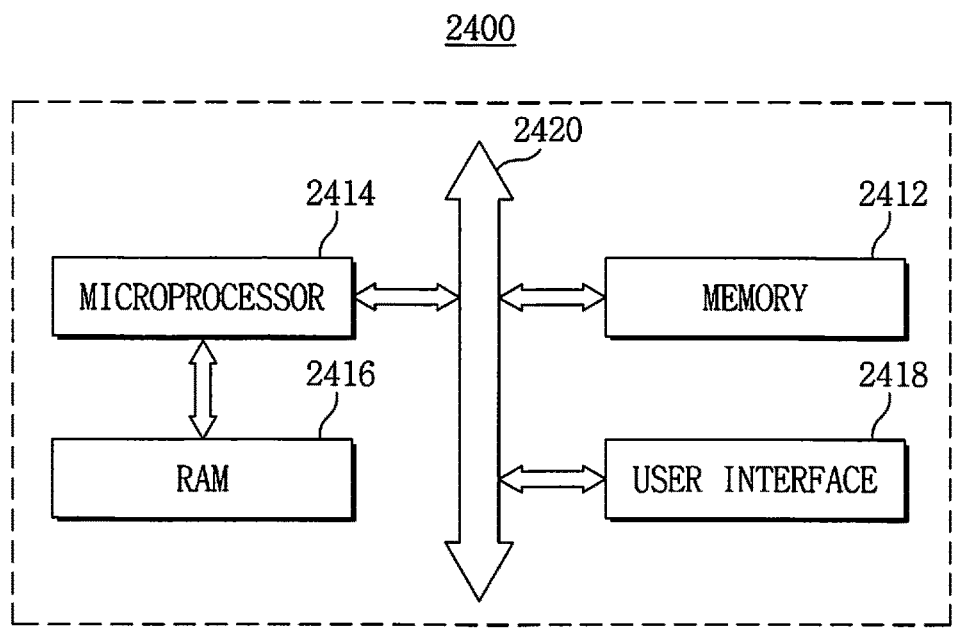

FIGS. 39 and 40 are system block diagrams showing electronic apparatuses in accordance with example embodiments of the inventive concepts.

Referring to FIG. 39, the semiconductor device described with reference to FIGS. 1 to 38 may be applied to an electronic system 2100. The electronic system 2100 may include a body 2110, a microprocessor 2120, a power unit 2130, a function unit 2140, and a display controller 2150. The body 2110 may be a motherboard formed of or including a printed circuit board (PCB). The microprocessor 2120, the power unit 2130, the function unit 2140, and the display controller 2150 may be installed on the body 2110. A display 2160 may be disposed inside or outside the body 2110. For example, the display 2160 may be disposed on a surface of the body 2110 and display an image processed by the display controller 2150.

The power unit 2130 may receive a constant voltage from an external battery, etc., divide the voltage into various levels of required voltages, and supply those voltages to the microprocessor 2120, the function unit 2140, and the display controller 2150, etc. The microprocessor 2120 may receive a voltage from the power unit 2130 to control the function unit 2140 and the display 2160. The function unit 2140 may perform various functions of the electronic system 2100. For example, when the electronic system 2100 is a smartphone, the function unit 2140 may have several components which perform functions of a mobile phone such as output of an image to the display 2160 or output of a voice to a speaker, by dialing or communication with an external apparatus 2170. When a camera is installed, the function unit 2140 may function as a camera image processor.

In the example embodiment to which the inventive concepts is applied, when the electronic system 2100 is connected to a memory card, etc. in order to expand a capacity thereof, the function unit 2140 may be a memory card controller. The function unit 2140 may exchange signals with the external apparatus 2170 through a wired or wireless communication unit 2180. Further, when the electronic system 2100 needs a Universal Serial Bus (USB), etc. in order to expand functionality, the function unit 2140 may function as an interface controller. Further, the function unit 2140 may include a mass storage apparatus.

The semiconductor device described with reference to FIGS. 1 to 38 may be included in the function unit 2140 or the microprocessor 2120.

Referring to FIG. 40, an electronic system 2400 may include at least one of the semiconductor devices in accordance with various example embodiments of the inventive concepts. The electronic system 2400 may be used to fabricate a mobile apparatus or a computer. For example, the electronic system 2400 may include a memory system 2412, a microprocessor 2414, a random access memory (RAM) 2416, a bus 2420, and a user interface 2418. The microprocessor 2414, the memory system 2412, and the user interface 2418 may be interconnected via the bus 2420. The user interface 2418 may be used to input data to or output data from the electronic system 2400. The microprocessor 2414 may program and control the electronic system 2400. The RAM 2416 may be used as an operational memory of the microprocessor 2414. The microprocessor 2414, the RAM 2416, and/or other components may be assembled in a single package. The memory system 2412 may store codes for operating the microprocessor 2414, data processed by the microprocessor 2414, or external input data. The memory system 2412 may include a controller and a memory device.

The semiconductor device described with reference to FIGS. 1 to 38 may be included in the microprocessor 2414, the RAM 2416, or the memory system 2412.

Figure 41:
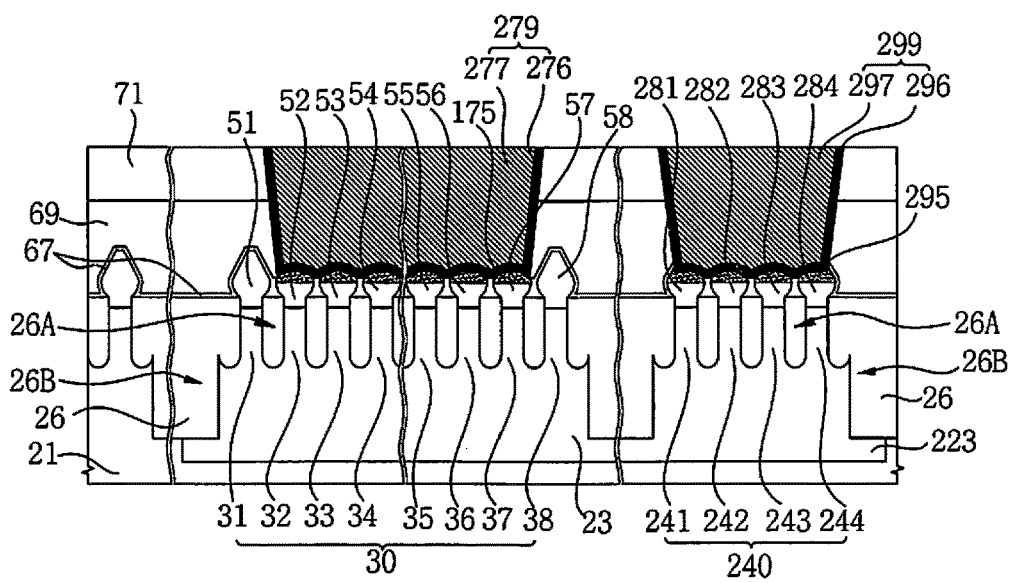
FIG. 41 is a cross-sectional view for describing a semiconductor device in accordance with an example embodiment of the inventive concepts.

FIG. 41 is a cross-sectional view for describing a semiconductor device in accordance with an example embodiment of the inventive concepts.

Referring to FIG. 41, a first well 23, a second well 223, the device isolation layer 26, a first multi-fin active 30, a second multi-fin active 240, impurity areas 51 to 58 and 281 to 284, an etch stop layer 67, a lower insulating layer 69, an upper insulating layer 71, a first metal silicide layer 175, a second metal silicide layer 295, a first contact plug 279, and a second contact plug 299 may be formed on a substrate 21. The first multi-fin active 30 may correspond to an input/output (I/O) device or a portion of a diode, and the second multi-fin active 240 may correspond to a logic circuit or a portion of a memory cell array.

The first multi-fin active 30 may include a first sub-fin 31, a second sub-fin 32, a third sub-fin 33, a fourth sub-fin 34, an $(N-3)^{th}$ sub-fin 35, an $(N-2)^{th}$ sub-fin 36, an $(N-1)^{th}$ sub-fin 37, and an $N^{th}$ sub-fin 38. The second multi-fin active 240 may include K sub-fins 241 to 244. For example, the second multi-fin active 240 may include a first sub-fin 241, a second sub-fin 242, a third sub-fin 243, and a fourth sub-fin 244. N is an integer greater than about eight (8) and smaller than about one thousand (1000). K is an integer greater than about two (2) and smaller than about seven (7). Each of the first contact plug 279 and the second contact plug 299 may have a reverse trapezoid shape in which a horizontal width of an upper portion is greater than that of a lower portion.

A bottom edge of the first contact plug 279 may be disposed between the first sub-fin 31 and the second sub-fin 32, or on the second sub-fin 32. A line which passes through the bottom edge of the first contact plug 279 and is perpendicular to the surface of the substrate 21 may be disposed between the first sub-fin 31 and the second sub-fin 32, or on the second sub-fin 32. The bottom edge of the first contact plug 279 may be defined as a position at which the bottom surface intersects the side surface of the first contact plug 279. A bottom edge of the second contact plug 299 may overlap the first sub-fin 241.

The first multi-fin active 30 may include N sub-fins 31 to 38. A first to an eighth impurity areas 51 to 58 may be formed on the N sub-fins 31 to 38. Each of the first to the eighth impurity areas 51 to 58 may include impurities having the same conductivity type. The first to the eighth impurity areas 51 to 58 may include second conductivity type impurities different from first conductivity type impurities. The first impurity area 51 and the eighth impurity area 58 may be formed in the outer side of the first contact plug 279. The second to the seventh impurity areas 52 to 57 may overlap the first contact plug 279. The second to the seventh impurity areas 52 to 57 may be electrically connected to the first contact plug 279. The concentration of the second conductivity type impurities in the second to the seventh impurity areas 52 to 57 may be higher than the concentration of the second conductivity type impurities in the first impurity area 51 and the eighth impurity area 58. The concentration of the second conductivity type impurities in the first impurity area 51 and the eighth impurity area 58 may be lower than that in the second to the seventh impurity areas 52 to 57.

A ninth impurity area 281 to a twelfth impurity area 284 may be formed on the K sub-fins 241 to 244. The ninth impurity area 281 to the twelfth impurity area 284 may include a crystal-growth material. The second metal silicide layer 295 may be selectively formed on the ninth impurity area 281 to the twelfth impurity area 284. The first contact plug 279 may include a first barrier layer 276 and a first conductive layer 277. The second contact plug 299 may include a second barrier layer 296 and a second conductive layer 297.

Figure 42:
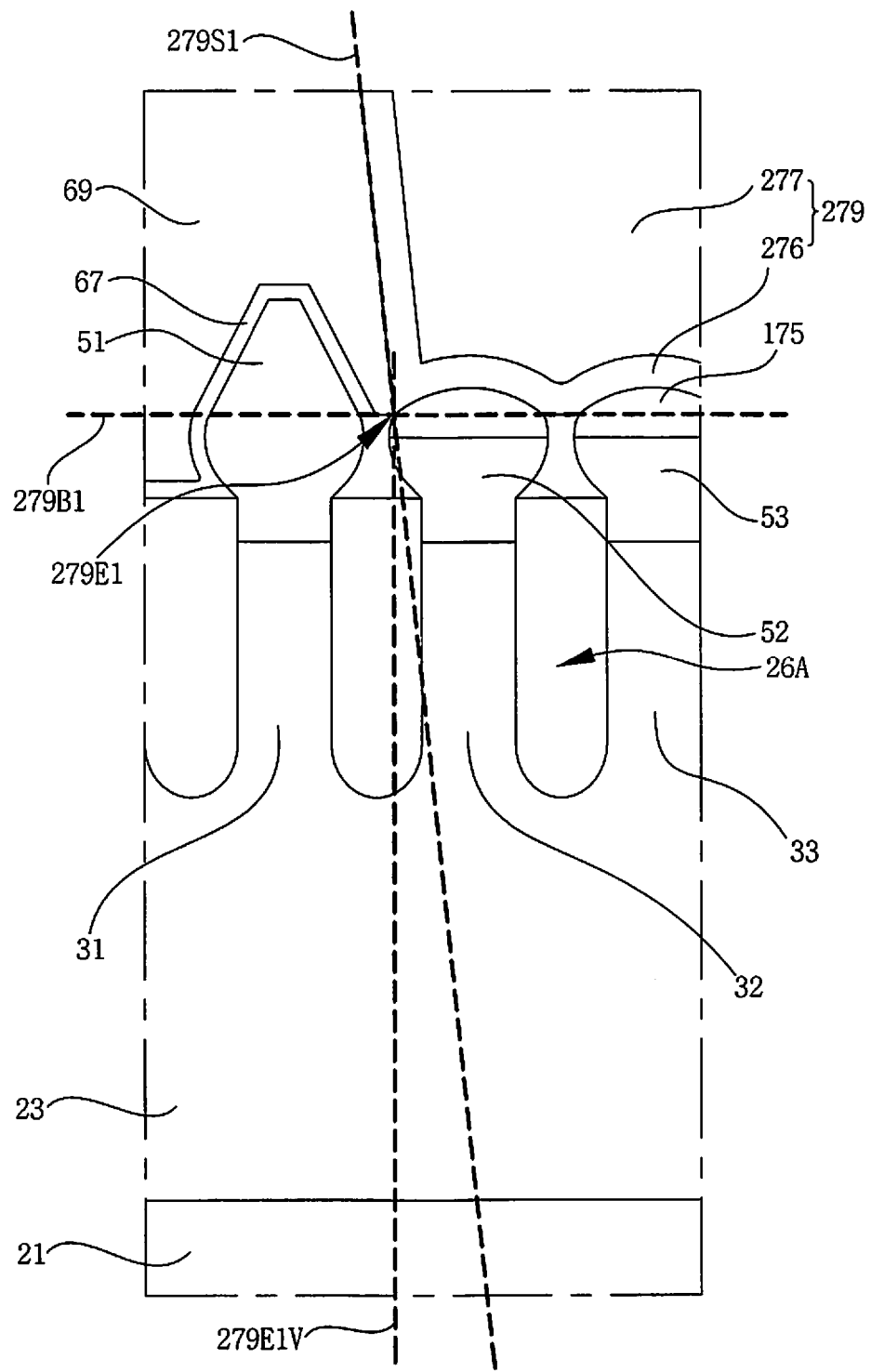
FIG. 42 is a partially enlarged view illustrating a portion of FIG. 41 in detail.

FIG. 42 is a partially enlarged view illustrating a portion of FIG. 41 in detail.

Referring to FIG. 42, a first correlation line 279S1 extending on one side surface of the first contact plug 279 may be defined. A first horizontal line 279B1 in contact with a lowermost end of the first contact plug 279 and parallel to the surface of the substrate 21 may be defined. A first virtual bottom edge 279E1 may be defined at a cross point of the first correlation line 279S1 and the first horizontal line 279B1. A first vertical line 279E1V may be defined as a line which is perpendicular to the surface of the substrate 21 and passes through the first virtual bottom edge 279E1. The first vertical line 279E1V may be disposed between the center between the first sub-fin 31 and the second sub-fin 32 and the second sub-fin 32 or on the second sub-fin 32. For example, the first vertical line 279E1V may pass through between the center between the first sub-fin 31 and the second sub-fin 32 and the second sub-fin 32. The first vertical line 279E1V may pass through the second sub-fin 32.

In an example embodiment, the first vertical line 279E1V may be disposed between the first sub-fin 31 and the second sub-fin 32 or on the second sub-fin 32. It may be understood that the first sub-fin 31 is formed in the outer side of the first contact plug 279.

Referring again to FIGS. 41 and 42, a second virtual bottom edge facing the first virtual bottom edge 279E1 may be defined. A second vertical line which is perpendicular to the surface of the substrate 21 and passes through the second virtual bottom edge may be disposed between the center between the $(N-1)^{th}$ sub-fin 37 and the $N^{th}$ sub-fin 38 and the $(N-1)^{th}$ sub-fin 37 or on the $(N-1)^{th}$ sub-fin 37. A third virtual bottom edge and a fourth virtual edge of the second contact plug 299 may be defined. A third vertical line which is perpendicular to the surface of the substrate 21 and passes through the third virtual bottom edge may pass through the first sub-fin 241. A fourth vertical line which is perpendicular to the surface of the substrate 21 and passes through the fourth virtual bottom edge may pass through the fourth sub-fin 244.

As set forth above, according to the example embodiments of the inventive concepts, a contact plug having a smaller horizontal width than a multi-fin active may be formed. A metal silicide layer may be formed between the multi-fin active and the contact plug. The metal silicide layer may be selectively formed below the contact plug. Leakage current of the contact plug can be significantly decreased. A semiconductor device having improved electrical characteristics can be implemented. The foregoing was for illustration of the embodiments of the present invention only and is not to be construed as limiting thereof. Although a few example embodiments have been described, those skilled in the art will readily appreciate that many modifications are possible without materially departing from the novel teachings and advantages.

What is claimed is:

1. A semiconductor device comprising:
   a first fin pattern on a substrate;
   a first protruding portion on the substrate, the first protruding portion being immediately adjacent to the first fin pattern;
   a field insulating film on the substrate, the field insulating film being on at least a portion of sidewalls of the first fin pattern; and a contact being on the first fin pattern, the contact being not electrically connected to the first protruding portion.

2. The semiconductor device of claim 1, further comprising a second protruding portion, wherein a lowest point of the substrate between the first and second protruding portions are lower than a lowest point of the substrate between the first protruding portion and the first fin pattern.

3. The semiconductor device of claim 1, wherein a top point of the first protruding portion is under a top surface of the field insulation film.

4. The semiconductor device of claim 1, wherein the contact includes a bottom surface having a wave form.

5. The semiconductor device of claim 1, further comprising an epitaxial source/drain region of the first fin pattern, wherein the epitaxial source/drain region of the first fin pattern receiving the contact is partially etched.

6. The semiconductor device of claim 5, further comprising an epitaxial source/drain region of a second fin pattern, wherein the epitaxial source/drain region of the second fin pattern receiving the contact is partially etched.

7. The semiconductor device of claim 6, wherein a majority portion of the epitaxial source/drain regions of the first and second fin patterns are above a top surface of the field insulation film.

8. A semiconductor device comprising:
a first fin pattern and a second fin pattern on a substrate;
a first protruding portion on the substrate, the first fin pattern being between the first protruding portion and the second fin pattern;
a field insulation film on the substrate, the field insulation film being between the first fin pattern and the second fin pattern; and
a contact partially overlapping an epitaxial source/drain region of the first fin pattern, entirely overlapping an epitaxial source/drain region of the second fin pattern, and not overlapping the first protruding portion.

9. The semiconductor device of claim 8, further comprising a second protruding portion, wherein a lowest point of the substrate between the first and second protruding portions are lower than a lowest point of the substrate between the first protruding portion and the first fin pattern.

10. The semiconductor device of claim 8, wherein a majority portion of the epitaxial source/drain regions of the first and second fin patterns are above a top surface of the field insulation film.

11. The semiconductor device of claim 8, wherein a top point of the first protruding portion is under a top surface of the field insulation film.

12. The semiconductor device of claim 8, wherein the contact includes a bottom surface having a wave form.

13. The semiconductor device of claim 8, wherein the epitaxial source/drain region of the first fin pattern receiving the contact is partially etched.

14. The semiconductor device of claim 13, wherein the epitaxial source/drain region of the second fin pattern receiving the contact is partially etched.

15. A semiconductor device comprising:
a first fin pattern and a second fin pattern on a substrate;
a first protruding portion on the substrate, the first fin pattern being between the first protruding portion and the second fin pattern;
a field insulation film on the substrate, the field insulating film being between the first fin pattern and the second fin pattern;
an epitaxial source/drain region of the first fin pattern, and an epitaxial source/drain region of the second fin pattern; and
a contact being on the epitaxial source/drain region of the first fin pattern and the epitaxial source/drain region of the second fin pattern,
wherein a bottom of the contact is above an imaginary horizontal line crossing a maximum width of the epitaxial source/drain regions of the first and second fin patterns.

16. The semiconductor device of claim 15, wherein a bottom surface of the contact has a wave shape and a lowest point of the wave shape is positioned between the first and second fin patterns.

17. The semiconductor device of claim 15, wherein a majority portion of the epitaxial source/drain regions of the first and second fin patterns are above a top surface of the field insulation film.

18. The semiconductor device of claim 15, wherein a top point of the first protruding portion is under a top surface of the field insulation film.

19. The semiconductor device of claim 15, wherein the epitaxial source/drain region of the first fin pattern receiving the contact is partially etched.

20. The semiconductor device of claim 19, wherein the epitaxial source/drain region of the second fin pattern receiving the contact is partially etched.

* * * * *